United States Patent
Iyer

(10) Patent No.: US 10,706,203 B1
(45) Date of Patent: *Jul. 7, 2020

(54) METHOD AND APPARATUS FOR VERIFYING INITIAL STATE EQUIVALENCE OF CHANGED REGISTERS IN RETIMED CIRCUITS

(71) Applicant: Altera Corporation, San Jose, CA (US)

(72) Inventor: Mahesh A. Iyer, Fremont, CA (US)

(73) Assignee: Altera Corporation, San Jose, CA (US)

( * ) Notice: Subject to any disclaimer, the term of this patent is extended or adjusted under 35 U.S.C. 154(b) by 554 days.

This patent is subject to a terminal disclaimer.

(21) Appl. No.: 15/079,518

(22) Filed: Mar. 24, 2016

(51) Int. Cl.
*G06F 30/398* (2020.01)
*G06F 30/30* (2020.01)

(52) U.S. Cl.
CPC ............ *G06F 30/398* (2020.01); *G06F 30/30* (2020.01)

(58) Field of Classification Search
CPC ... G06F 17/505; G06F 17/5081; G06F 30/398
See application file for complete search history.

(56) References Cited

U.S. PATENT DOCUMENTS

| | | | |
|---|---|---|---|
| 7,171,634 B2 | 1/2007 | Sawkar et al. | |
| 9,824,177 B1 | 11/2017 | Iyer | |
| 10,157,247 B2 | 12/2018 | Iyer et al. | |
| 2002/0116685 A1 | 8/2002 | Ginneken | |
| 2004/0068331 A1* | 4/2004 | Cronquist | G06F 17/5045 700/18 |
| 2004/0225970 A1 | 11/2004 | Oktem | |
| 2005/0289498 A1* | 12/2005 | Sawkar | G06F 17/505 716/104 |
| 2018/0018416 A1 | 1/2018 | Iyer et al. | |
| 2018/0039724 A1 | 2/2018 | Iyer | |

OTHER PUBLICATIONS

Mneimneh, et al.; "REVERSE: Efficient Sequential Verification for Retiming"; Twelfth International Workshop on Logic and Synthesis, Laguna Beach, California, May 28-30, 2003.
Leiserson, et al.; "Retiming Synchronous Circuitry"; Algorithmica (1991) 6: 5-35.
Ex Parte Quayle Office Action for U.S. Appl. No. 15/718,424, dated Apr. 9, 2018, 7 pages.

(Continued)

*Primary Examiner* — Jack Chiang
*Assistant Examiner* — Aric Lin

(57) ABSTRACT

A method for designing a system on a target device includes performing register retiming on an original design to generate a retimed design of the system. Compare points are identified in the original design and the retimed design. Equality constraints are defined for all compare points. Starting from the initial states of the original and retimed circuits, bounded sequential logic simulation is performed for a maximum number of time frames determined as the maximum absolute value of retiming variables computed during structural verification. Whether changed flip-flops in the retimed design have initial states that are correct are determined by comparing signal values at the compare points from the bounded sequential logic simulation.

18 Claims, 19 Drawing Sheets

(56) References Cited

OTHER PUBLICATIONS

First Office Action for U.S. Appl. No. 15/079,390, dated May 11, 2017, 6 pages.
First Office Action for U.S. Appl. No. 15/079,475, dated Jul. 16, 2018, 20 pages.
Huang et al., "On Verifying the Correctness of Retimed Circuits", Mar. 1996, Proceedings of IEEE Sixth Great Lakes Symposium on VLSI, pp. 277-280.
Moon, "Compositional Verification of Retiming and Sequential Optimizations", Jun. 2008, Proceedings of the 45th Annual Design Automation Conference (DAC), pp. 131-136.
Shenoy et al., "Efficient Implementation of Retiming", Nov. 1994, Proceedings of the IEEE/ACM, Internal Conference on Computer-Aided Design, pp. 226-233.
Stoffel et al., "Structural FSM Traversal", May 2004, IEEE Transactions on Computer-Aided Design of Integrated Circuits and Systems, vol. 23, Iss. 5, pp. 598-619.
First Office Action for U.S. Appl. No. 15/790,009, dated Nov. 29, 2018, 7 pages.
U.S. Appl. No. 15/079,475, filed Mar. 24, 2016.

\* cited by examiner

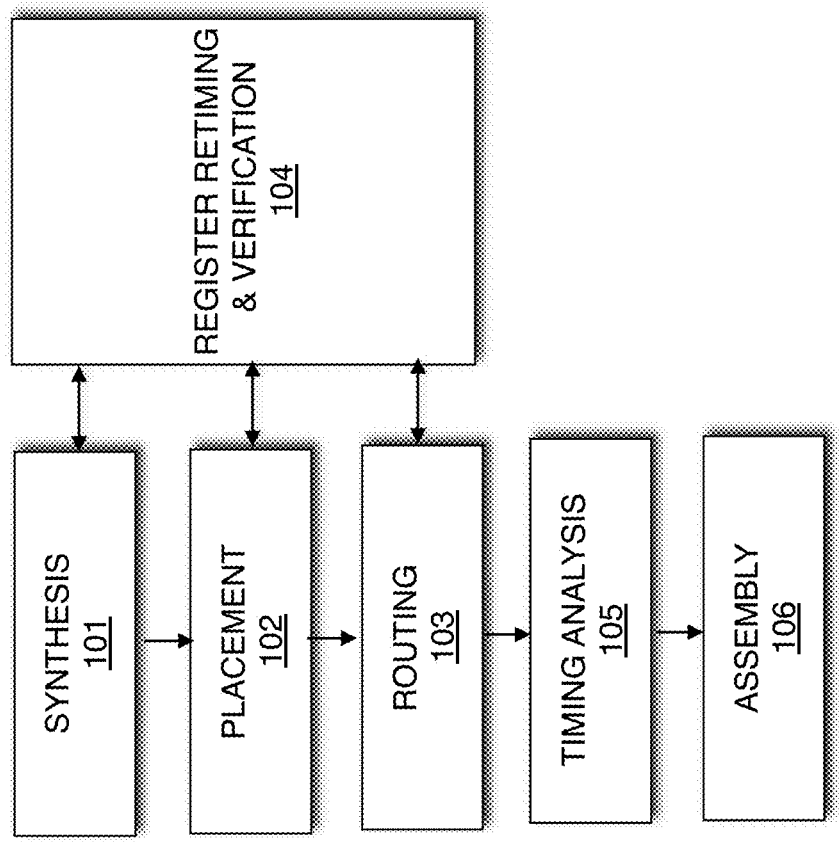

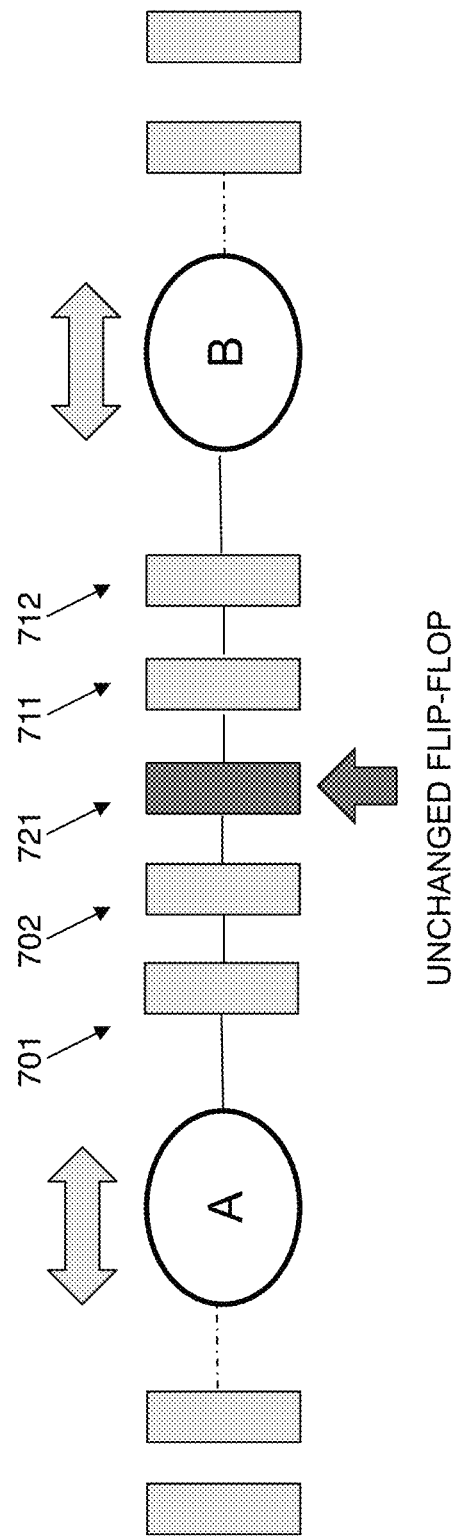

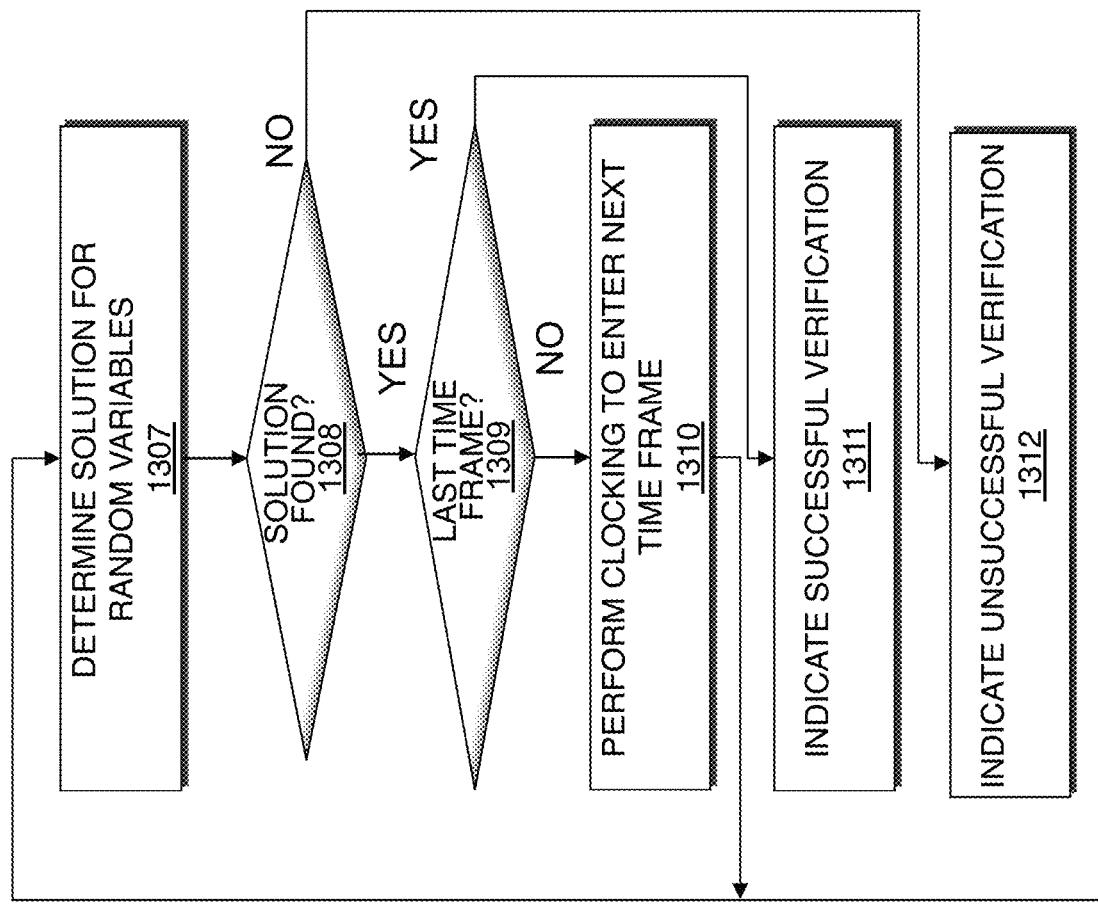
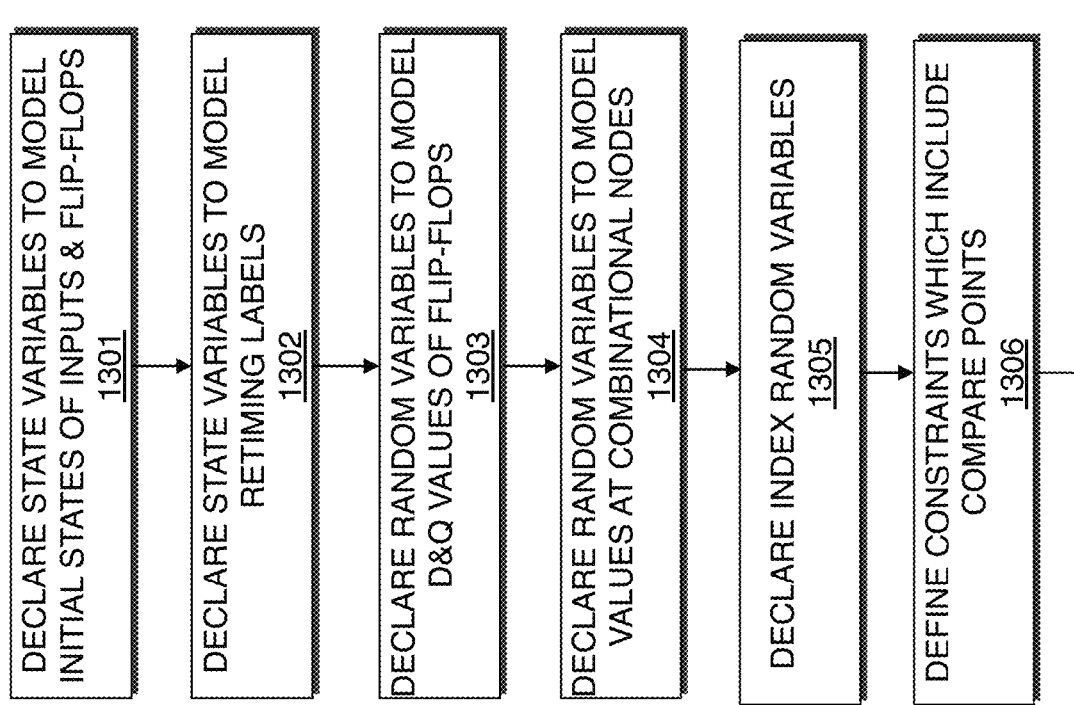
FIG. 13

METHOD AND APPARATUS FOR VERIFYING INITIAL STATE EQUIVALENCE OF CHANGED REGISTERS IN RETIMED CIRCUITS

Embodiments of the present invention relate to tools for designing systems on target devices. More specifically, embodiments of the present invention relate to a method and apparatus for verifying initial state equivalence of changed registers in retimed circuits.

BACKGROUND

Target devices such as field programmable gate arrays (FPGAs), structured application specific integrated circuits (ASICs), and ASICs are used to implement large systems that may include million of gates and megabits of embedded memory. The complexity of a large system often requires the use of electronic design automation (EDA) tools to create and optimize a design for the system onto physical target devices. Among the procedures performed by EDA tools in a computer aided design (CAD) compilation flow is hardware description language (HDL) compilation. HDL compilation involves performing synthesis, placement, routing, and timing analysis of the system on the target device.

Functional verification is a procedure that may also be performed during HDL compilation by EDA tools. Functional verification is used to ensure the functional correctness of implemented circuits. When used, more than 70% of a design cycle may be spent performing functional verification. Techniques that may be used for functional verification include simulation and formal verification. Simulation is typically used to verify the correctness of Register-Transfer-Level (RTL) circuit description against design intent. Constrained random simulation is a technique that may be used to reduce simulation time and to increase functional coverage efficiency. Constrained random simulation has been shown to be effective in identifying bugs early in a design cycle. Once RTL is implemented using EDA tools, formal verification may be used to verify the correctness of a circuit against the RTL description. Formal verification can be a computationally difficult problem to solve as it seeks to mathematically prove that the two circuits being compared have identical functional behavior. To cope with this complexity, some formal verification techniques and tools in the industry are combinational verification tools. Combinational verification tools use primary outputs and register boundaries as compare points for the two circuits being compared for equivalency.

SUMMARY

A method and apparatus for verifying structural correctness in retimed circuits is disclosed. According to an embodiment of the present disclosure, a method in which an original circuit is transformed to a retimed circuit is reverse engineered. Using new constraints, a procedure is performed to determine whether the retimed circuit may be retimed back to the original circuit by solving for retiming labels. The retiming labels identify a number of flip-flops that are repositioned and a direction the flip-flops are repositioned relative to a node in a circuit. If the procedure is successful, it is concluded that the retimed circuit's structural netlist is structurally correct.

A method and apparatus for verifying initial state equivalence of unchanged flip-flops in retimed circuits is disclosed. According to an embodiment of the present disclosure, unchanged flip-flops in retimed circuits are identified using the retiming labels and weights. The weights indicate a number of flip-flops that are on an edge in a circuit. The initial state of unchanged flip-flops prior to retiming and after retiming are compared to verify initial state equivalence.

A method and apparatus for verifying initial state equivalence of changed flip-flops in retimed circuits is disclosed. According to an embodiment of the present disclosure, register retiming is performed on an original design to generate a retimed design of a system. Register retiming may then be performed to retime the retimed design back to the original design by solving for retiming labels on every combinational node of the system. A maximum absolute value of the retiming labels for the system is identified. Compare points are identified on the initial design and the retimed design that reflect the behavior of one or more changed registers using the retiming labels for the system. Bounded sequential logic simulation is performed with the number of time frames determined from the maximum absolute value of the retiming labels for the system. Whether changed flip-flops in the retimed circuits have correct initial states are determined by comparing signal values at the compare points from each time frame of the bounded simulation.

BRIEF DESCRIPTION OF THE DRAWINGS

The features and advantages of embodiments of the present invention are illustrated by way of example and are not intended to limit the scope of the embodiments of the present invention to the particular embodiments shown.

FIG. 1 is a flow chart illustrating a method for designing a system on a target device according to an exemplary embodiment of the present disclosure.

FIG. 7 illustrates an example of changed and unchanged flip-flops after register retiming according to an exemplary embodiment of the present disclosure.

FIG. 13 is a flow chart illustrating a method for identifying compare points and performing bounded sequential logic simulation according to an embodiment of the present disclosure.

DETAILED DESCRIPTION

Figure 2A:
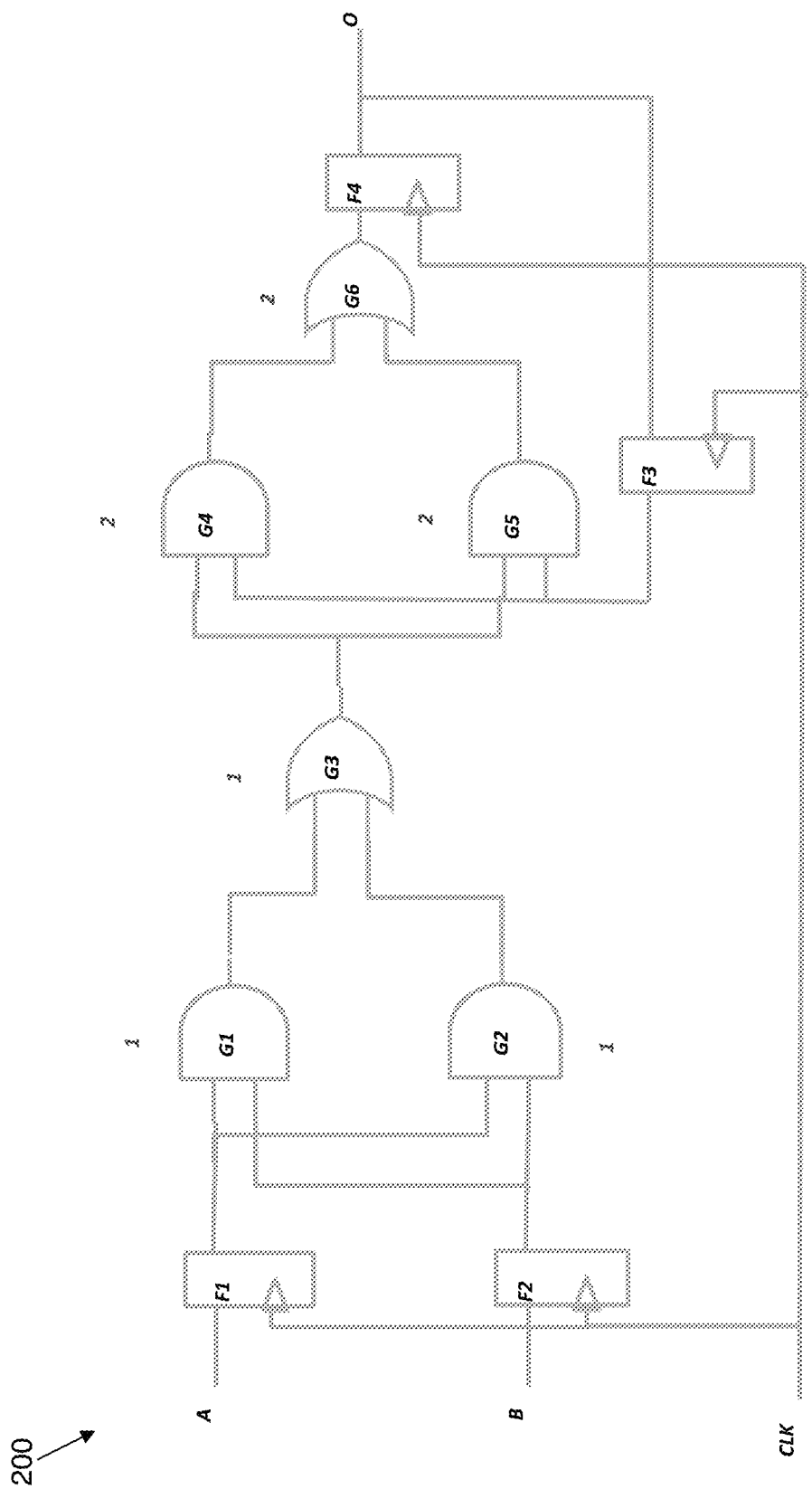
FIGS. 2A-2C illustrate an example of register retiming according to an exemplary embodiment of the present disclosure.

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, procedures, and programs are shown in block diagram form to avoid obscuring embodiments of the present invention unnecessarily.

FIG. 1 is a flow chart illustrating a method for designing a system on a target device according to an exemplary embodiment of the present disclosure. The target device may be a field programmable gate array (FPGA), application specific integrated circuit (ASIC), a structured ASIC, or other device. According to one embodiment, the procedure illustrated in FIG. 1 may be performed by a computer aided design (CAD)/electronic design automation (EDA) tool implemented on a computer system.

At 101, a design for the system is synthesized. The specification for the system may be provided though a design entry tool. The specification may describe components and interconnections in the system. According to an embodiment of the present invention, the design entered may be in register transfer level (RTL) in a hardware description language (HDL). Synthesis includes generating a logic design of the system to be implemented by the target device. According to an embodiment of the present invention, synthesis generates an optimized logical representation of the system from an HDL design definition. The optimized logical representation of the system may include a representation that has a minimized number of functional blocks such as logic gates, logic elements, and registers required for the system. Synthesis also includes mapping the optimized logical representation. Mapping includes determining how to implement logic gates and logic elements in the optimized logic representation with the types or categories of resources available on the target device. The resources available on the target device may be referred to as "cells" or "components" and may include logic-array blocks, registers, memories, digital signal processing blocks, input output elements, and other components. According to an embodiment of the present invention, a netlist is generated from mapping. This netlist may be an optimized technology-mapped netlist generated from the HDL.

At 102, the system is placed. According to an embodiment of the present invention, placement involves placing the technology-mapped logical system design on the target device. Placement includes fitting the system on the target device by determining which specific resources on the target device are to be assigned to and implemented by the technology-mapped netlist determined during synthesis. Placement may include clustering which involves grouping logic elements together to form the logic clusters present on the target device.

At 103, the placed design is routed. During routing, routing resources on the target device are allocated to provide interconnections between logic gates, logic elements, and other components on the target device. Routability optimization may also be performed on the placed logic design. According to an embodiment of the present invention, the goal of routability optimization is to reduce the amount of wiring used to connect components in the placed logic design. Routability optimization may include performing fanout splitting, logic duplication, logical rewiring, or other procedures. It should be appreciated that one or more of the procedures may be performed on the placed logic design.

At 104, register retiming and verification is performed on the system. According to an embodiment of the present invention, register retiming improves the performance of sequential circuit by repositioning flip-flops (registers) without changing the combinational elements between flip-flops and/or input outputs (IOs) that have the worst delay. Reducing the delay on combinational paths is the goal of register retiming. After register retiming, verification is performed on the retimed design for the system to confirm that retimed design is equivalent to the original design. It should be appreciated that register retiming and verification 104 may be performed during and/or after synthesis 101, placement 102, and/or routing 103.

At 105, timing analysis is performed on the retimed design of the system generated. According to an embodiment of the present invention, the timing analysis determines whether timing constraints of the system are satisfied.

At 106, assembly is performed. The assembly procedure involves creating a data file that includes information determined by the procedures described at 101-105. The data file may be a bit stream that may be used to program a target device. By programming the target with the data file, components on the target device are physically transformed to implement the system.

Figure 2B:
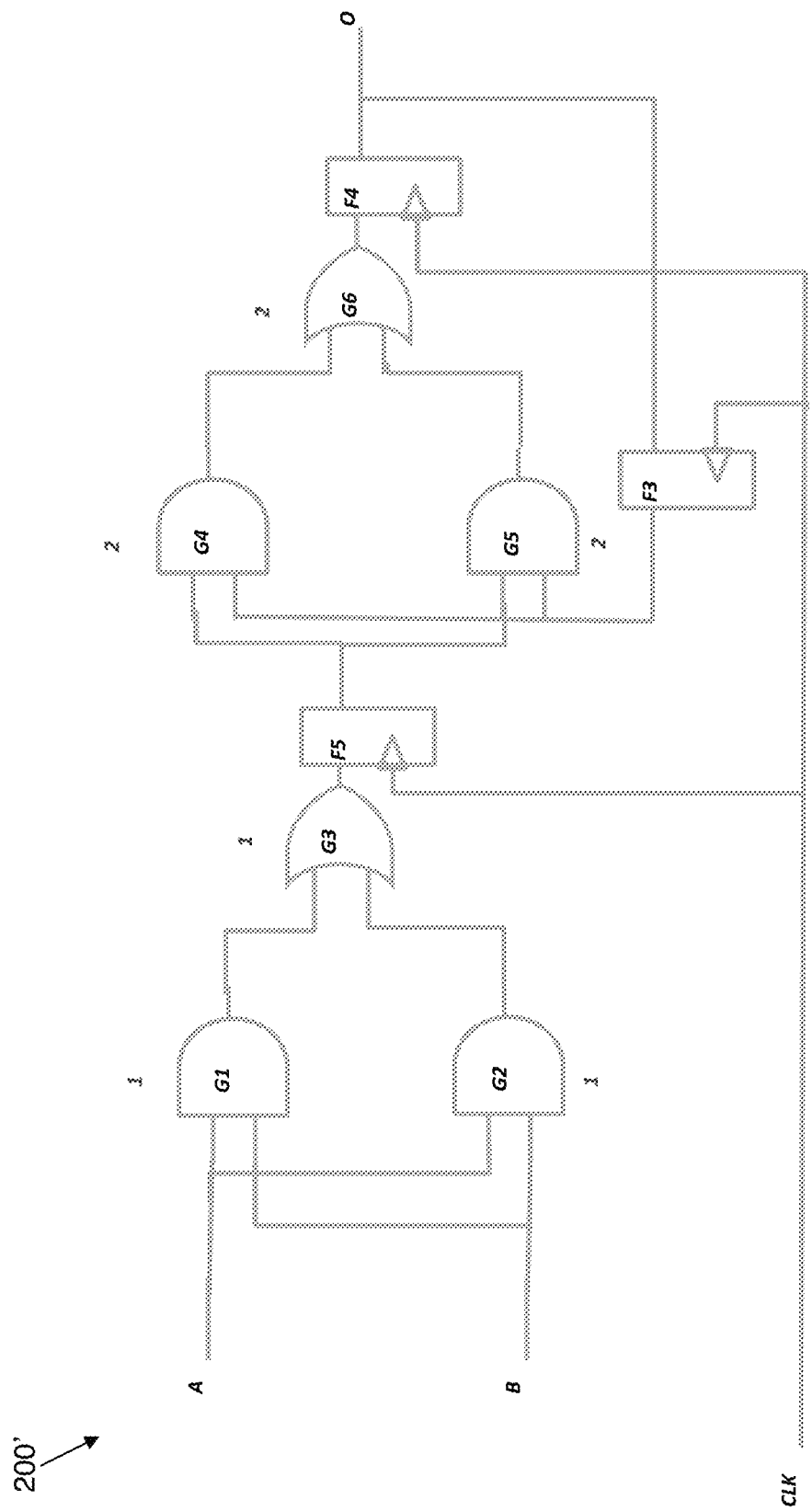
Figure 2C:
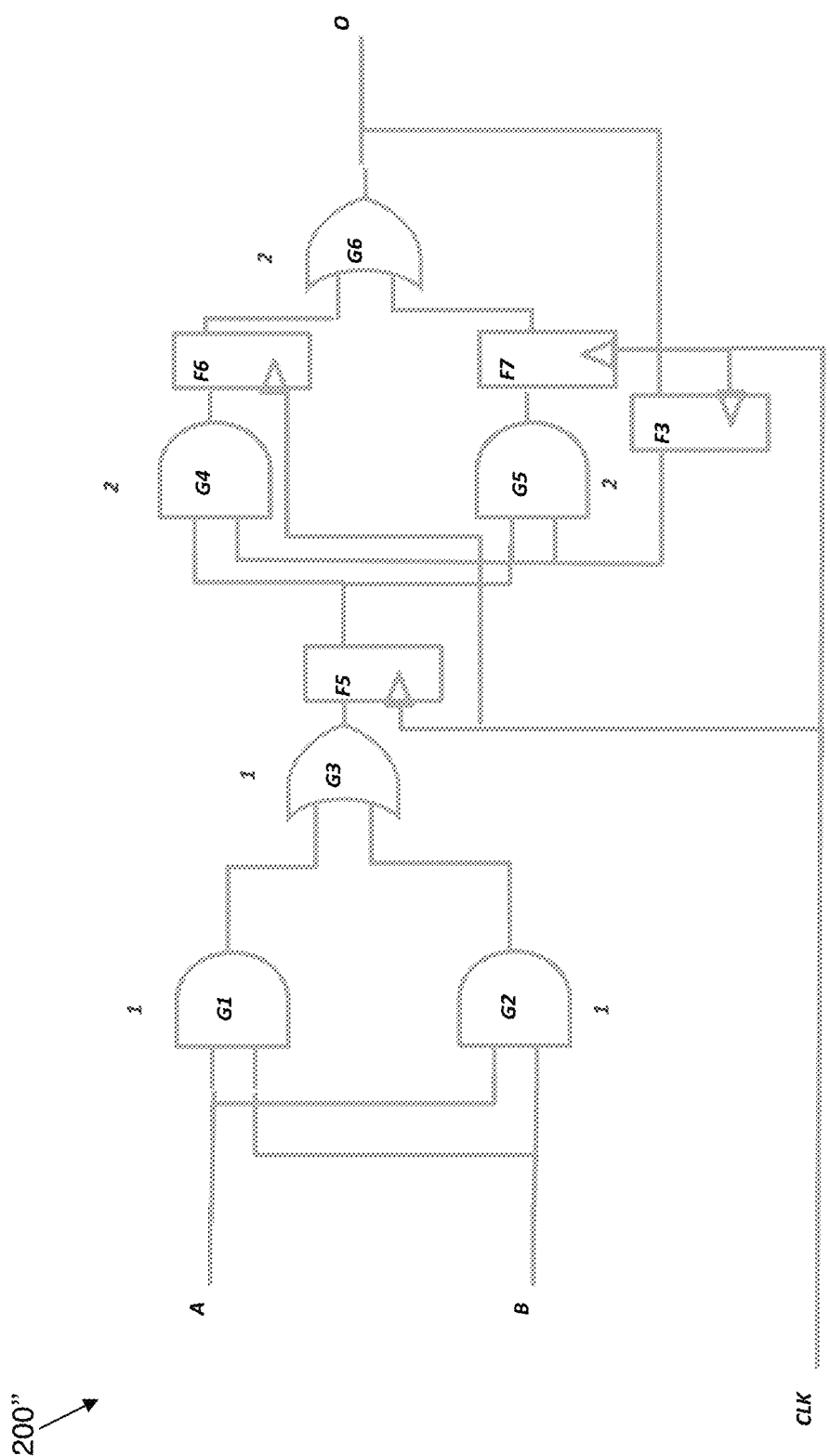

Referring back to 104, it should be appreciated that various approaches to register retiming may be taken. Min-period retiming may be performed where flip-flops are repositioned in a circuit to achieve the best delay to minimize a clock period of the circuit. Min-period retiming does not impose a restriction on a number of flip-flops in the circuit after register retiming. Min-area retiming may be performed where flip-flops are repositioned in the circuit to minimize a number of flip-flops in the circuit. Min-area retiming does not impose a restriction on a clock period of the circuit after register retiming. Constrained min-area retiming may be performed where flip-flops are repositioned in the circuit to minimize a number of flip-flops in the circuit subject to a user-specified clock period constraint. A practical variant of constrained min-area retiming is the approach of minimizing a number of flip-flops in a circuit while achieving a best clock period that is closest to a user-specified clock period constraint. It should be appreciated that a combination of these approaches may be taken when performing register retiming at 104. FIGS. 2A-2C illustrate an example of register retiming according to an embodiment of the present disclosure.

FIG. 2A illustrates an exemplary sequential circuit 200 according to an embodiment of the present disclosure. This sequential circuit 200 has six combinational gates, G1, G2, G3, G4, G5, and G6 with delays of 1, 1, 1, 2, 2, 2 respectively, as shown. The sequential circuit 200 also has four flip-flops, F1, F2, F3, F4 that are all positive edge-triggered flip-flops clocked by the same clock CLK. The sequential circuit 200 has 3 primary inputs A, B, and CLK, one primary output, O, and fanouts reconverging on gates G3 and G6. The maximum combinational delay through this circuit is 6. One such path is F1→G1→G3→G4→G6→F4. The clock period for this circuit is dictated by this longest path delay of 6.

FIG. 2B illustrates a retimed sequential circuit 200'. The retimed sequential circuit 200' has flip-flops F1 and F2 forward retimed through gates G1, G2, and G3. Retimed sequential circuit 200' has only 3 flip-flops and the maximum combinational delay is 4. This is the minimum number of flip-flops that is achievable for this circuit.

FIG. 2C illustrates a further retimed sequential circuit 200". The sequential circuit 200' from FIG. 2B has its clock period reduced by backward retiming flip-flop F4 across gate G6. This backward-retimed circuit is shown in FIG. 2C. Sequential circuit 200" has a maximum combinational delay of 2 for all input-to-flip-flop, flip-flop-to-flip-flop, and flip-flop-to-output paths. Since the worst delay of a single combinational cell in this circuit is 2, this is the minimum delay that can be achieved. Hence the sequential circuit 200" in FIG. 2C represents the min-period retiming solution.

A synchronous sequential circuit, such as the circuit shown in FIGS. 2A-C, may include a plurality of combinational logic gates and flip-flops. When performing register retiming on a synchronous sequential circuit, the following assumptions may be made. All flip-flops in the circuit are clocked by the same clock source with the same edge relationship. Clock skew to all the registers are zero. Delays of all combinational gates are fixed and do not depend on actual loading seen by the gates. There are no asynchronous loops. Complex registers including load, synchronous clear, and clock enable may be modeled with simple D flip-flops and associated combinational logic. All flip-flops have a known power-up state that is configurable to either 0 or 1. All logic gates in the circuit can produce a 0 and 1 for some input combination of values, and no logic gate is a constant function.

According to an embodiment of the present disclosure, when performing register retiming on the synchronous sequential circuit, the circuit is modeled as a retiming graph G(V, E), where the vertices represent the combinational logic gates and the edges represent the connection to other combinational logic gates, inputs or outputs of the circuit traversing through one or more flip-flops. Each edge has a corresponding weight that represents the number of flip-flops on that edge connection.

Figure 3:
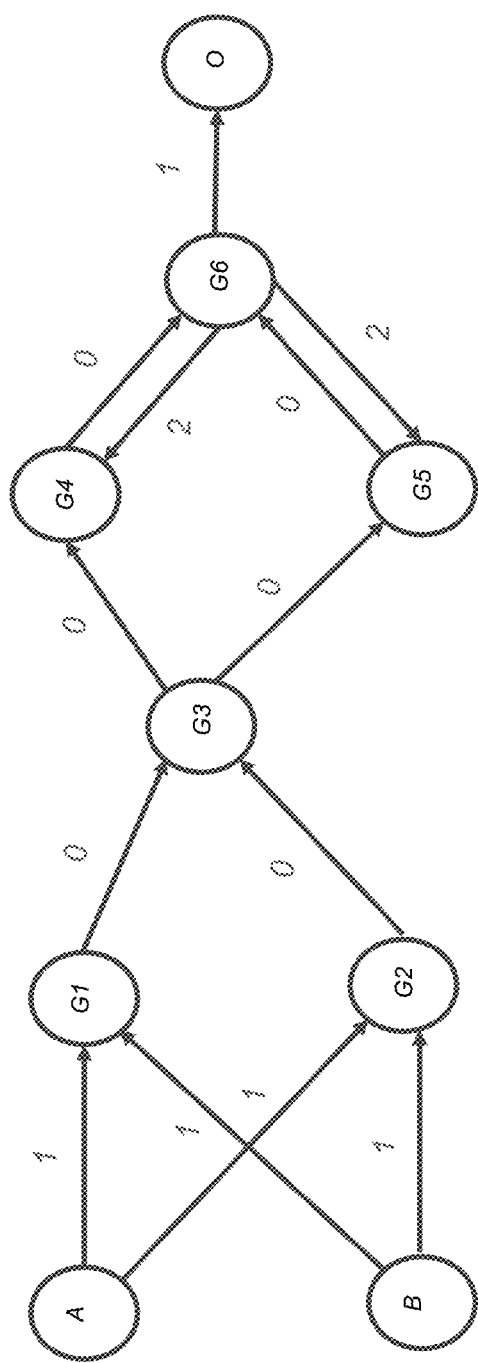
FIG. 3 illustrates a retiming graph according to an exemplary embodiment of the present disclosure.

FIG. 3 illustrates a retiming graph 300 according to an exemplary embodiment of the present disclosure. Retiming graph 300 represents the synchronous sequential circuit 200 shown in FIG. 2A. As shown, every fanout edge is modeled explicitly in the graph. The weights next to each edge in the graph represent the number of flip-flops in that connection. For example, there exist two flip-flops on the path from the output of gate G6 to the input of gate G5. This is modeled as an edge from G6 to G5 with a weight of 2.

Register retiming attempts to label every vertex, i, in a retiming graph with a label $r_i$ that represents the number of flip-flops that move across vertex i. Label $r_i$ is an integer and can be positive or negative. A positive (negative) value of $r_i$ indicates the number of flip-flops that moved backward (forward) across vertex i as part of the retiming solution. The labels of the primary input and primary output nodes are fixed at 0. A retiming label of 0 implies there is no movement of flip-flops across that vertex.

The weight of an edge from vertex u to vertex v may be represented by $w_{uv}$, and the weight of the same edge after retiming be represented by $nw_{uv}$. The relationship between these terms may be illustrated below.

$$nw_{uv} = r_v + w_{uv} - r_u \quad (1)$$

A path p exists from vertex a to vertex b if there is a sequence of vertices and edges from vertex a to vertex b, such that each vertex on the path has as input a directed edge from the previous vertex on the path. It should be appreciated that the path may be sequential or combinational, meaning that the number of flip-flops on all the edges in a path may be ≥0. The weight of the path, $w_p$, is the sum of the weights of all edges on the path. A combinational path has $w_p=0$. The clock period of the circuit is determined by the worst delay for all combinational paths in the circuit.

The following matrix relationships further illustrate how register retiming is performed.

$$W(u, v) = \min_{p: u \to v} \{w_p\} \quad (2)$$

$$D(u, v) = \max_{p: u \to v \text{ and } w_p = W(u,v)} \{d_p\} \quad (3)$$

The W matrix in relationship (2) records an entry for every pair (u, v) of vertices that have a path between them. The entry that is recorded is the number of flip-flops on a path from u→v that has the minimum number of flip-flops. This path has the minimum latency from u→v. For every pair of vertices (u, v), the D matrix in relationship (3) stores the maximum delay of the path from u→v whose flip-flop count was stored in the W matrix.

When taking the min-period retiming approach, the following constraints need to be satisfied. After retiming, all edge weights need to be non-negative ($nw_{uv} \geq 0$). This allows relationship (1) to be represented with the following relationship.

$$r_v - r_u \geq -w_{uv} \quad (4)$$

In addition, for a clock period, c, each path from u>v that has D(u, v)>c requires at least one register on it. This constraint is illustrated with the following relationship.

$$r_v - r_u \geq -W(u,v)+1 \quad \forall u \to v \text{ such that } D(u,v) > c \quad (5)$$

When taking the constrained min-area retiming approach, embodiments of the present disclosure attempts to find a retiming solution that satisfies a user-specified clock period with the minimum number of registers. The constraints for the retiming solution to be valid are the same as those found in relationships (4) and (5). The complete formulation for the constrained min-area retiming for a target clock period of c is shown as follows.

$$\min \Sigma_{v \in V}(|FI(v)| - |FO(v)|)r_v$$

$$r_v - r_u \geq -w_{uv} \forall e_{uv} \in E$$

$$r_v - r_u \geq -W(u,v)+1 \forall D(u,v) > c \quad (6)$$

The computation of the W and D matrices is central to most retiming algorithms. These matrices are primarily used to solve the constrained min-area retiming problem which involves adding new edges to the retiming graph that represent timing constraints. In addition to the original "circuit" edges, additional "period" edges corresponding to the timing constraints in relationships (5) and (6) are added to the graph. These period edges from u→v have a weight of W(u, v)−1.

Figure 4:
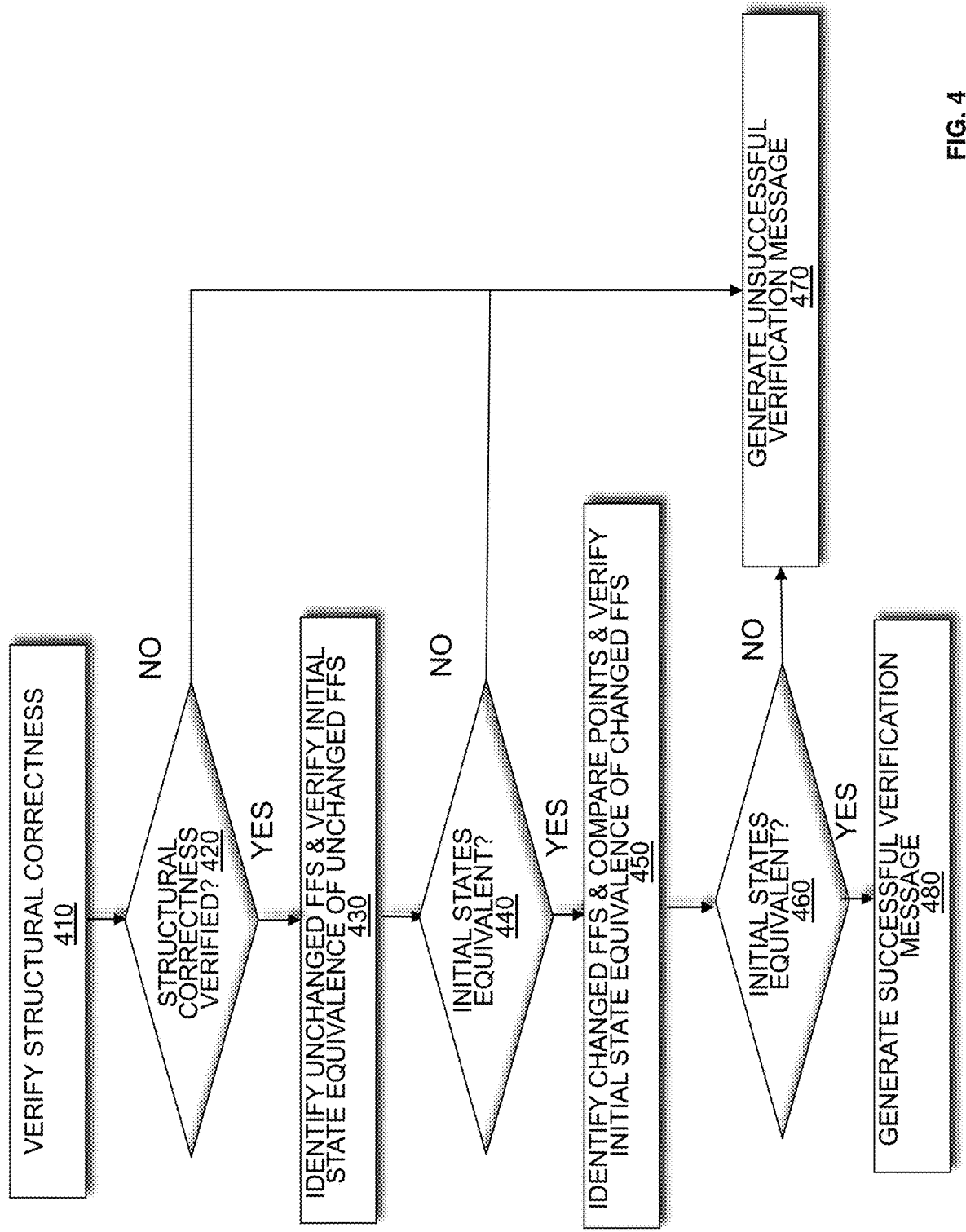
FIG. 4 is a flow chart illustrating a method for performing verification of a retimed circuit according to an exemplary embodiment of the present disclosure.

FIG. 4 is a flow chart illustrating a method for performing verification of a retimed circuit according to an exemplary embodiment of the present disclosure. The procedures illustrated in FIG. 4 may be used to implement procedure 104 (shown in FIG. 1) in part.

At 410, the structural correctness of a retimed circuit is verified. The circuit may be a design implemented on a target device. According to an embodiment of the present disclosure, the structural correctness of the retimed circuit is verified by reversing how an initial circuit is retimed using constrained random simulation. New constraints are formulated to retime the retimed circuit back to the initial circuit. If the procedure is successful, then the retimed structural netlist transforms are determined to be correct.

At 420, it is determined whether structural correctness has been verified. If structural correctness has been verified, control proceeds to 430. If structural correctness has not been verified, control proceeds to 470.

At 430, unchanged flip-flops are identified and the initial state equivalence of unchanged flip-flops in the retimed circuit are verified.

At 440, it is determined whether initial state equivalence exists between the unchanged flip-flops in the retimed circuit and the initial circuit. If initial state equivalence exists between the unchanged flip-flops, control proceeds to 450. If initial state equivalence does not exist between the unchanged flip-flops, control proceeds to 470.

At 450, changed flip-flops and sequential compare points are identified, and the initial state equivalence of changed flip-flops in the retimed circuit is verified. According to an embodiment of the present disclosure, this verification is achieved using bounded sequential logic simulation.

At 460, it is determined whether initial state equivalence exists between the changed flip-flops in the retimed circuit and the initial circuit. If initial state equivalence exists between the changed flip-flops, control proceeds to 480. If initial state equivalence does not exist, between the changed flip-flops, control proceeds to 470.

At 470, a message is generated indicating that verification was unsuccessful.

At 480, a message is generated indicating that verification was successful.

An original or initial circuit before retiming may be referred as $C_o$. A retimed circuit may be referred to as $C_r$. Structural correctness may be verified if it can be shown that $C_r$ represents a correct structural retiming of $C_o$. A key aspect of the present disclosure is based on the reversibility property for retimed circuits and that a correct retiming operation is reversible. Forward retiming across a gate includes moving a flip-flop from all inputs of a gate to the output of the gate. The flip-flops on the inputs of the gate need to be compatible for this operation to be structurally legal. Similarly, backward retiming involves moving a flip-flop from its output to all its inputs. Both these retiming operations are reversible. A forward (backward) retimed circuit can be reversed using backward (forward) retiming on the same combinational element.

Forward retiming across a fanout involves moving a flip-flop from a fanout stem to the outputs of the gates on the fanout branches. Similarly, backward retiming across a fanout point involves moving compatible flip-flops from the output of the fanout gates to the fanout stem. Similar to retiming across gates, both these retiming operations are reversible. A forward (backward) retimed circuit can be reversed using backward (forward) retiming on the same fanout gates.

According to an embodiment of the present disclosure, the reversibility property and relationship (1) are utilized to verify structural correctness of a retimed circuit. The weights on each of the edges before and after retiming are known. Since it is assumed that retiming does not change the combinational elements of a circuit, every edge in the retimed circuit graph has a corresponding edge in the original circuit graph. Given the reversible property of retimed circuits, a retimed circuit that has been retimed correctly structurally can be retimed to the original circuit. For an edge from vertex u to vertex v, the weight on this edge in the retimed circuit, $w_{uv}$, and the weight of this edge in the original circuit, $nw_{uv}$, is known. For structural verification purposes, the retiming labels, $r_u$ and $r_v$, may be computed to satisfy relationship (1). The retiming labels or (r variables) for all edges in the graph are simultaneously computed to satisfy relationship (1) for all edges on the retiming graph.

If the retiming labels can be computed to satisfy relationship (1), it can be concluded that the circuit was correctly retimed structurally. The value of the retiming labels on each combinational node vertex of the retiming label indicates how the original circuit was transformed to the retimed circuit. Therefore, verification has reversed engineered exactly which and how many flip-flops structurally moved in the circuit during the retiming operation. If the retiming labels cannot be computed to satisfy relationship (1), it can be concluded that the circuit was not correctly structurally retimed, and this results in a verification failure.

By attempting to retime the retimed circuit back to the original circuit, embodiments of the present disclosure are solving only a special case of a global retiming problem. The global retiming problem explores all retiming solutions and yields a best solution for objectives being optimized which may be, for example, delay and area. By solving only a special case, the technique of the present disclosure requires less time and fewer resources than the technique used for register retiming. Thus the worst-case computational complexity of this technique is no worse than that of the retime itself.

Figure 5:
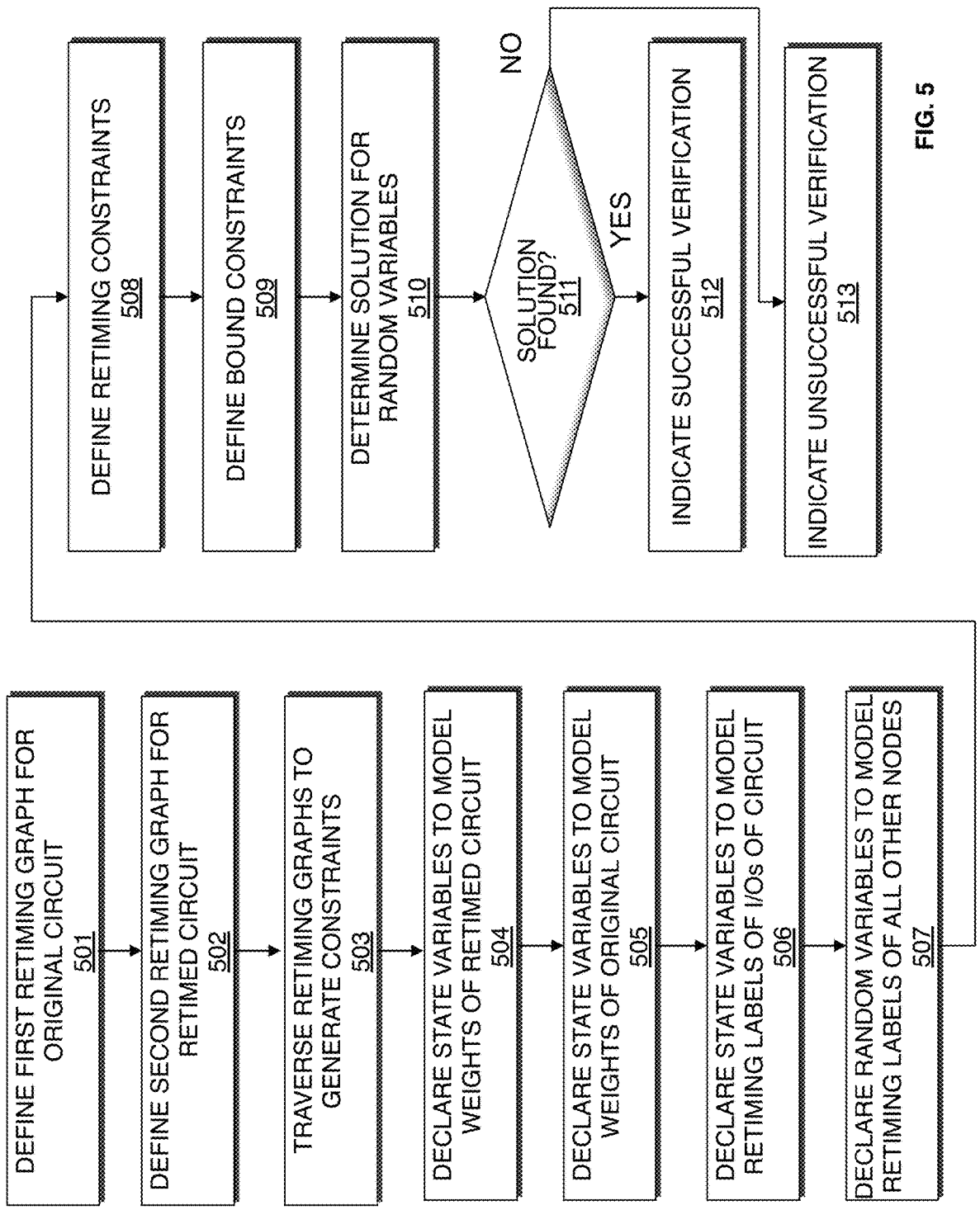
FIG. 5 is a flow chart illustrating a method for verifying structural correctness in a retimed circuit according to an exemplary embodiment of the present disclosure.

FIG. 5 is a flow chart illustrating a method for verifying structural correctness in a retimed circuit according to an exemplary embodiment of the present disclosure. The procedures illustrated in FIG. 5 may be used to implement procedure 410 (shown in FIG. 4).

At 501, a first retiming graph is generated from an HDL description of an original circuit. According to an embodiment of the present disclosure, the retiming graph models combinational nodes as vertices with weights on edges representing a number of flip-flops between corresponding combinational nodes represented by that edge.

At 502, a second retiming graph is generated from an HDL description of a retimed circuit. According to an embodiment of the present disclosure, the second retiming graph models the retimed circuit in a similar manner that the first retiming graph models the original circuit. The first and second retiming graphs may be traversed, and constraints may be generated and solved in the manner described as follows.

At 503, the first and second retiming graphs are traversed to generate constraints. According to an embodiment of the present disclosure, the constraints may be processed by a constraint solver.

At 504, a first set of state variables is defined. The first set of state variables models weights for edges in a retimed circuit. A weight for an edge in the retimed circuit represents a number of flip-flops on the edge. As described above, structural correctness of a retimed circuit is verified by retiming a retimed circuit and determining whether the resulting circuit is the original circuit.

At 505, a second set of state variables is defined. The second set of state variables models weights for edges in an original circuit. A weight for an edge in the original circuit represents a number of flip-flops on the edge. As described above, structural correctness of a retimed circuit is verified by retiming a retimed circuit and determining whether the resulting circuit is the original circuit.

At 506, a third set of state variables is defined. The third set of state variables models retiming labels for inputs and outputs of the circuit. A retiming label identifies a number of flip-flops that move across its associated vertex. The state variables identified at 503-505 have values that do not change.

At 507, random variables are defined. The random variables model retiming labels for nodes other than the inputs and outputs of the circuit. The random variables model retiming labels for all combinational nodes.

At 508, retiming constraints are defined. According to an embodiment of the present disclosure, for each edge in the retiming graph of the circuit, a retiming constraint is modeled from relationship (1). The state variables and random variables defined at 504-506 are used to formulate the retiming constraints.

At 509 bound constraints are defined. According to an embodiment of the present disclosure, bound constraints may be used to limit a range for the random variables.

At 510, a solution for the random variables is sought. According to an embodiment of the present disclosure, values for the random variables are solved for given the state variables and constraints defined. Solutions for the random variables may be computed using an equation solving routine or program. At 511, it is determined if a solution for the random variables is found. If a solution for the random variables is found, control proceeds to 512. If a solution for the random variables is not found, control proceeds to 513.

At 512, an indication is generated to indicate that structural correctness verification is successful.

At 513, an indication is generated to indicate that structural correction verification was unsuccessful.

In addition to solving for the retiming labels defined, the method illustrated in FIG. 5 may also identify a maximum absolute value among all retiming labels.

The following example illustrates how the verification method described with reference to FIGS. 4 and 5 may be performed on the sequential circuit illustrated in FIG. 2A and the retiming graph illustrated in FIG. 3 according to an embodiment of the present disclosure. SystemVerilog is used as the programming language in this example. It should be appreciated, however, that other programming languages or tools may be used to implement the methodology described. With reference to FIG. 5, procedures 501-503 may be performed using known methodologies. The example below begins at procedure 504.

At 504, a first set of state variables is declared that models weights for edges in the retimed circuit 200" shown in FIG. 2C. The weights for the edges in the retimed circuit 200" represent a number of flip-flops on the edges. Since all gates in this circuit have two inputs, the notation we use is that the first input pin is a, the second input pin is b, and the output is z. For example, arrays and variables with a1 in their names are referring to the a input of gate G1. The primary output node O is modeled with array and variable names that contain out.

//FF counts in retimed circuit
integer win1, win2, wout;
integer wa1, wb1;
integer wa2, wb2;
integer wa3, wb3;
integer wa4, wb4;
integer wa5, wb5;
integer wa6, wb6;

According to an embodiment of the disclosure, defining the state variables that model weights for the edges of the retimed circuit may include initializing the state variables as shown below.

//Setup FF counts of retimed circuit
win1=0;
win2=0;
wa1=0;
wb1=0;
wa2=0;
wb2=0;
wa3=0;
wb3=0;
wa4=1;
wb4=1;
wa5=1;
wb5=1;
wa6=1;
wb6=1;
wout=0;

At 505, a second set of state variables are defined that models weights for edges in the original circuit 200 shown in FIG. 2A. The weights for the edges in the original circuit 200 represent a number of flip-flops on the edges.

//FF counts in original circuit
integer new_wa1, new_wb1;
integer new_wa2, new_wb2;
integer new_wa3, new_wb3;
integer new_wa4, new_wb4;
integer new_wa5, new_wb5;
integer new_wa6, new_wb6;
integer new_wout;

According to an embodiment of the disclosure, defining the state variables that model weights for the edges of the original circuit may include initializing the state variables as shown below.

//Setup FF counts of original circuit
new_wa1=1;
new_wb1=1;
new_wa2=1;
new_wb2=1;
new_wa3=0;
new_wb3=0;
new_wa4=0;
new_wb4=2;
new_wa5=0;
new_wb5=2;
new_wa6=0;
new_wb6=0;
new_wout=1;

At 506, a third set of state variables are defined that models retiming label variables for inputs and outputs of the circuit 200 shown in FIG. 2A (circuit 200" shown in FIG. 2C).

//Retiming labels for primary inputs and
primary outputs integer rin1, rin2, rout;

According to an embodiment of the disclosure, defining the state variables that model the retiming label variables for inputs and outputs may include initializing the state variables as shown below.

//Setup r variables for inputs and outputs
rin1=0;
rin2=0;
rout=0;

At 507, random variables are defined to models retiming labels for nodes other than the inputs and outputs of the circuit 200 (or circuit 200", since they have the same combinational nodes).

//Random variables
rand integer r1, r2, r3, r4, r5, r6;

At 508, retiming constraints are defined for each edge in the retiming graph of the circuit shown in FIG. 3.

//Retiming constraints
new_wa1==(r1+wa1−rin1);
new_wb1==(r1+wb1−rin2);
new_wa2==(r2+wa2−rin1);
new_wb2==(r2+wb2−rin2);
new_wa3==(r3+wa3−r1);
new_wb3==(r3+wb3−r2);
new_wa4==(r4+wa4−r3);
new_wb4==(r4+wb4−r6);
new_wa5==(r5+wa5−r3);
new_wb5==(r5+wb5−r6);
new_wa6==(r6+wa6−r4);
new_wb6==(r6+wb6−r5);
new_wout==(rout+wout−r6);

At 509, bound constraints are defined to limit a range for the random variables. It should be appreciated that this procedure is optional. According to an embodiment of the disclosure, if it can be assumed that movement of flip-flops will not be required beyond a certain number during register retiming, values for the variable $r_i$ may be constrained to allow for more efficient computation. The following bound constraints may be defined.

r1>=−max_ffs; //−(2^29−1)
r1<=max_ffs;
r2>=−max_ffs;
r2<=max_ffs;
r3>=−max_ffs;
r3<=max_ffs;
r4>=−max_ffs;
r4<=max_ffs;
r5>=−max_ffs;
r5<=max_ffs;
r6>=−max_ffs;
r6<=max_ffs;

In this example, max_ffs may be set to a value that will prune the search space for the constraint solver. According to an embodiment of the disclosure max_ffs may be set to a total number of flip-flops in the circuit.

At 510, solutions for the random variables are sought given the defined state variables and constraints using an equation solver. In this example, the following solutions were found for the random variables.

r1=1
r2=1
r3=1
r4=0
r5=0
r6=−1

At 511, since a solution for the random variables is found, control proceeds to 512 and an indication is generated to indicate that structural correctness verification is successful. Although this example shows an example of a correct structural retiming, the constraints solver would fail if the retimer had performed an incorrect structural retiming. According to an embodiment of the present disclosure, the constraints solver identifies the minimal set of constraints that caused the failure, enabling a debug procedure.

Referring back to 430 in FIG. 4, after structural correctness has been verified, initial state equivalence of unchanged flip-flops may also be verified. Retimed circuits do not necessarily demonstrate the same sequential behavior as its original or initial circuit for all possible initial state conditions. The following example illustrates this phenomenon.

Figure 6A:
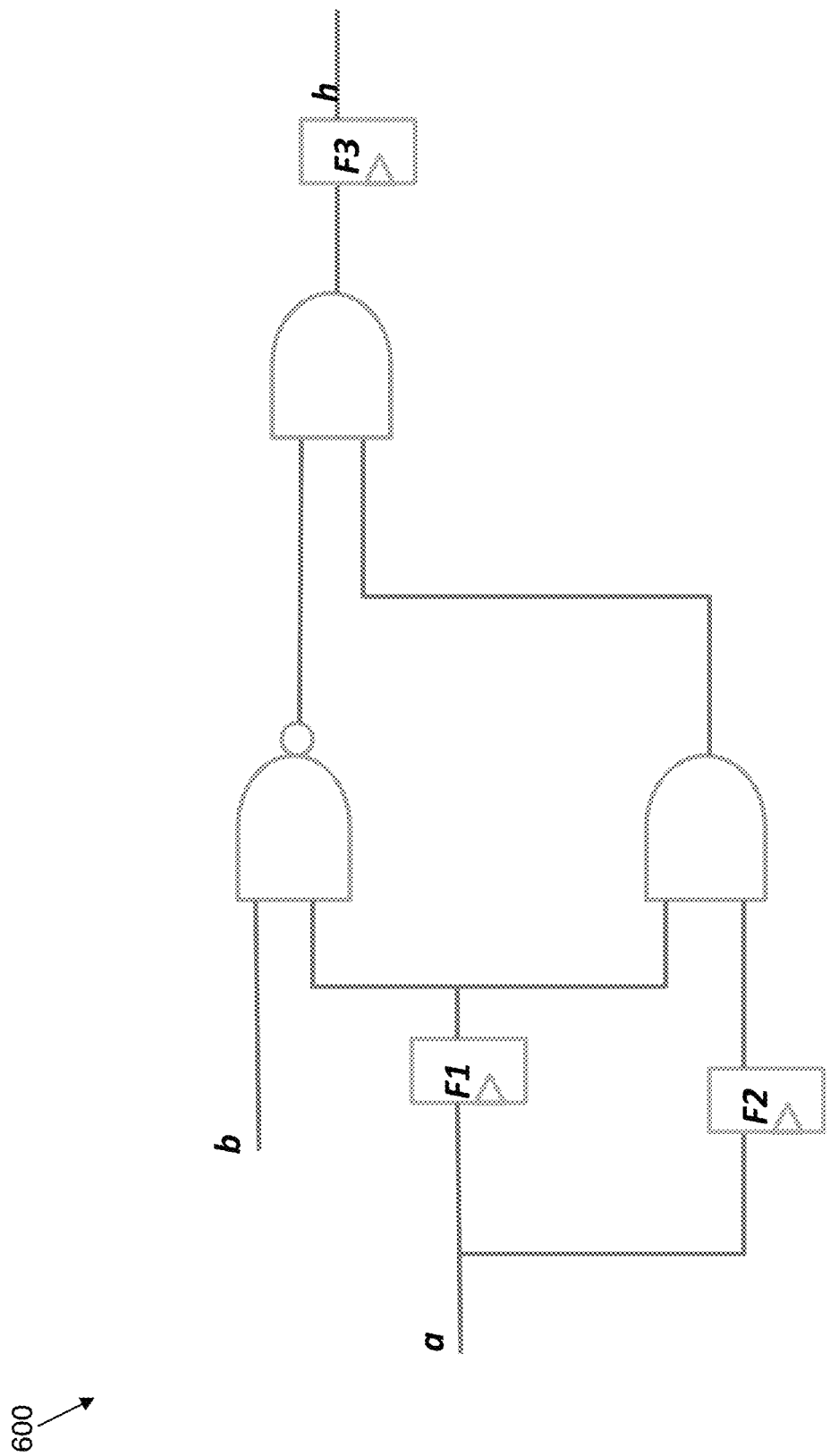
FIGS. 6A-6B illustrate an example of a pipeline sequential circuit and a retimed pipeline sequential circuit.

FIG. 6A illustrates an example of a pipeline sequential circuit 600. The pipeline sequential circuit 600 is a 2-stage pipeline circuit that may be initialized with a single vector a=0, b=1. For all possible initial states of flip-flops F1 and F2, this vector with a single clock cycle produces and output of h=0.

Figure 6B:
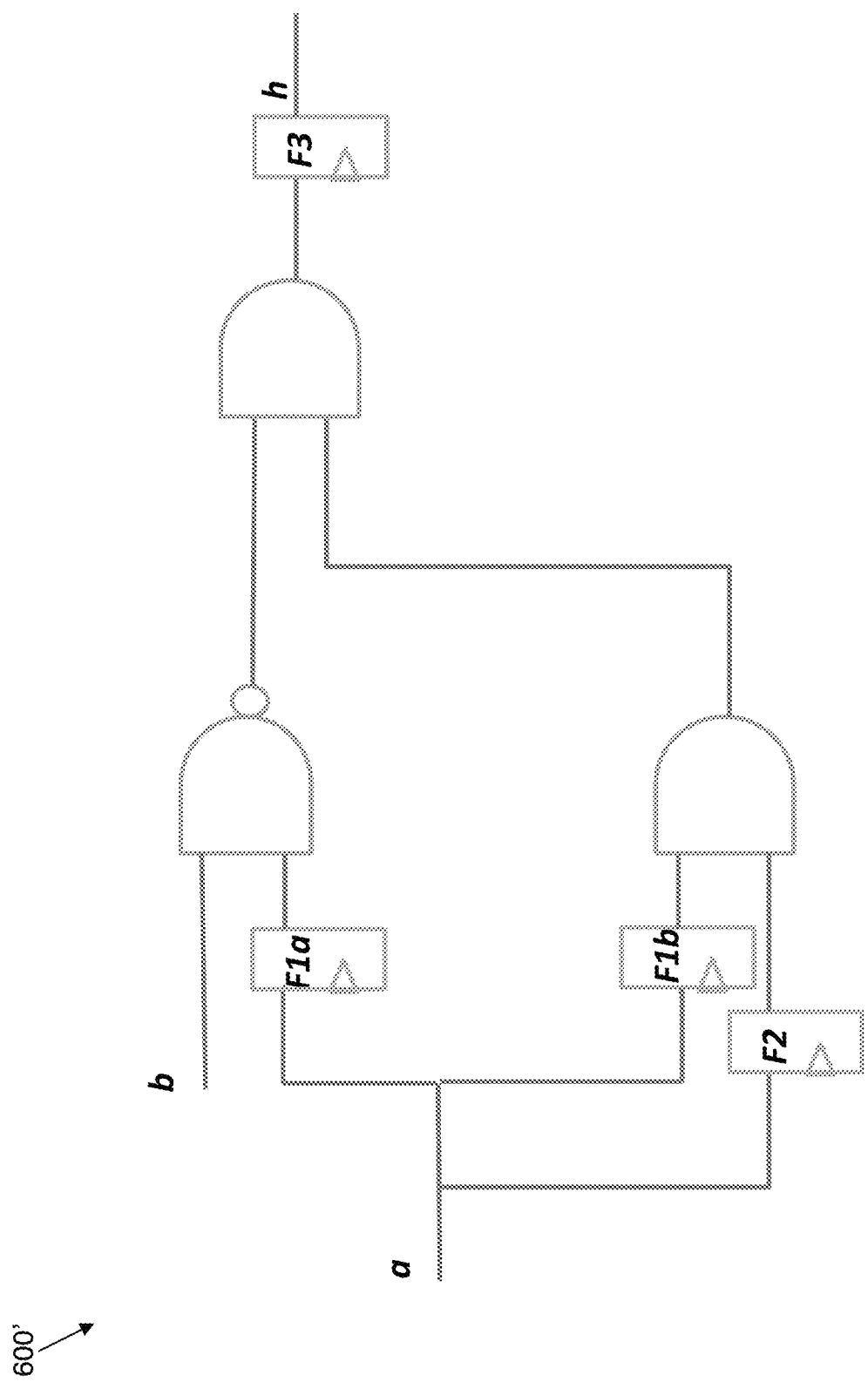

FIG. 6B illustrates the pipeline sequential circuit 600 retimed as 600'. As shown, flip-flop F1 is repositioned forward onto its fanout branches and is illustrated as F1a and F1b in FIG. 6B. For an initial state F1a=0, F1b=1, and F2=1, and an initial vector a=0, b=1, the output h=1 results. This initial state behavior cannot be observed in the original circuit 600 illustrated in FIG. 6A. As such, by definition of strict sequential equivalence, the pipeline sequential circuit 600 and retimed pipeline sequential circuit 600' are not identical. To overcome this issue, we assume that all flip-flops in the target device have a deterministic power-up initial state, that is programmable to 0 or 1. A retimer for such a device architecture will then determine new initial power-up states for the retimed flip-flops, based on the initial power-up state of the corresponding flip-flops in the original circuit and the logic functionality of the combinational logic across which the flip-flops got retimed.

According to an embodiment of the present disclosure, results generated from verifying structural correctness of a retimed circuit may be used to determine whether initial state computations for flip-flops are performed correctly. Flip-flops may be categorized as unchanged or changed. Unchanged flip-flops are flip-flops that do not move during retiming, whereas changed flip-flops are flip-flops that move during retiming.

FIG. 7 illustrates an example of changed and unchanged flip-flops after register retiming according to an exemplary embodiment of the present disclosure. During retiming, flip-flops may move across combinational elements A and B. In this example, flip-flops 701-702 move from an initial position from the right of element A to a new position to the left of element A or vice versa. Similarly, flip-flops 711-712 move from an initial position from the left of element B to a new position to the right of element B, or vice versa. Flip-flop 721 did not move during retiming. Flip-flops 701-702 and 711-712 are considered changed flip-flops. Flip-flop 721 is an unchanged flip-flop.

As described with reference to verifying structural correctness, an original or initial circuit before retiming may be referred as $C_o$. Embodiments of the present disclosure verify that unchanged flip-flops in a retimed circuit $C_r$ have the same initial power-up state values as original circuit $C_o$. Results from the structural verification procedure described are used to identify the unchanged flip-flops and to perform the verification of equivalence of initial power-up state values of unchanged flip-flops in the retimed circuit. Specifically, the computed retiming labels in conjunction with old and new weights of each edge in the retiming graph are utilized.

It should be appreciated that the initial state values for flip-flops on each edge in an original and retimed circuit may be represented as separate arrays of values. For each such array on an edge from source u to destination v, using retiming labels $r_u$ and $r_v$, respectively, and original and retimed weights $o_w$ and $r_w$, a left index $l_i$ and right index $l_r$ are computed. If $l_i$ is less than or equal to $l_r$, it is concluded that the values in the array between $l_i$ and $l_r$ indices represent unchanged flip-flops. The values of the corresponding unchanged flip-flops in the array representing the retimed circuit and the array representing the original circuit may be compared to ensure that they are identical. If the values are not identical, a verification failure occurs and an error message is generated identifying the connection where the mismatch resides.

Figure 8:
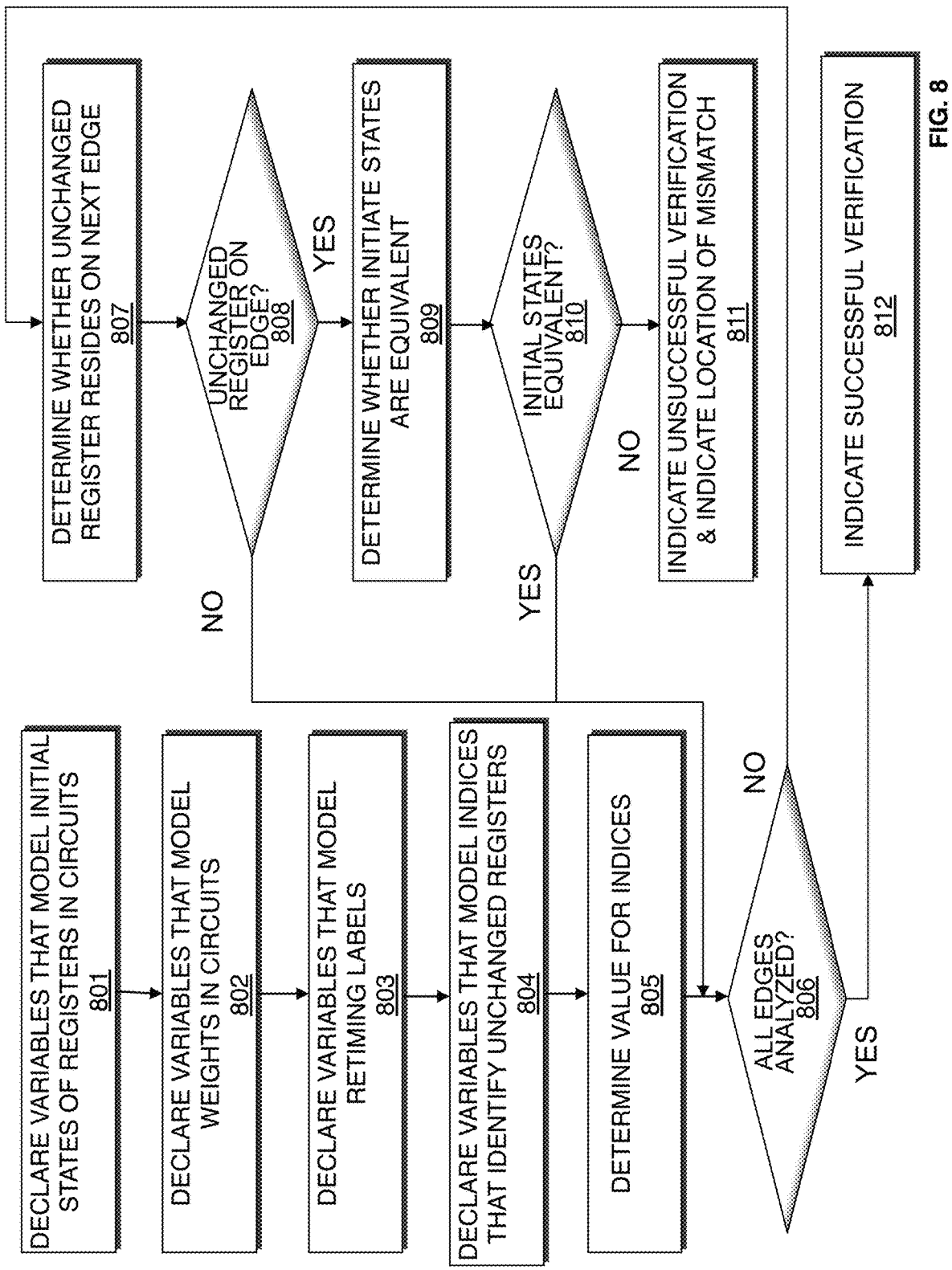
FIG. 8 is a flow chart illustrating a method for verifying initial state equivalence of unchanged flip-flops in a retimed circuit according to an embodiment of the present disclosure.

FIG. 8 is a flow chart illustrating a method for verifying initial state equivalence of unchanged flip-flops in a retimed circuit according to an embodiment of the present disclosure. The procedures illustrated in FIG. 8 may be used to implement procedure 430 (shown in FIG. 4). It should be appreciated that prior to performing the procedures in FIG. 8, a first retiming graph is generated from an HDL description of an original circuit and a second flow chart is generated from an HDL description of a retimed circuit. According to an embodiment of the present disclosure, the retiming graphs model combinational nodes as vertices with weights on edges representing a number of flip-flops between corresponding combinational nodes represented by that edge. The first and second retiming graphs may be traversed, and constraints may be generated and solved in the manner described as follows.

At 801, variables that model initial states of registers in an initial circuit and a retimed circuit are declared. According to an embodiment of the present disclosure, the variables may be represented as static arrays for each edge in the original and retimed circuits. An initial state of a register is the state of the register at power-up. The values for the initial states or registers for the original circuit and the retimed circuit are known after register retiming.

At 802, variables that model weights in the original circuit and the retimed circuit are declared. According to an embodiment of the present disclosure, a weight for an edge in a circuit represents a number of flip-flops on the edge. The values for the weights for the original circuit and the retimed circuit are known after register retiming.

At 803, variables that model retiming labels are declared. According to an embodiment of the present disclosure, a retiming label identifies a number of flip-flops that move across its associated vertex. The values for the retiming labels are known after verification of structural correctness. As such, they represent state variables for the purposes of verifying the initial state equivalence of unchanged flip-flops.

At 804, variables that model indices that identify unchanged registers are declared. According to an embodiment of the present disclosure, for each array of initial state variables declared at 801, two indices are declared a left index and a right index. For any edge, the two indices are identified such that a range of values between the two indices represent unchanged flip-flops, if any unchanged flip-flops exist on the edge.

Figure 9:
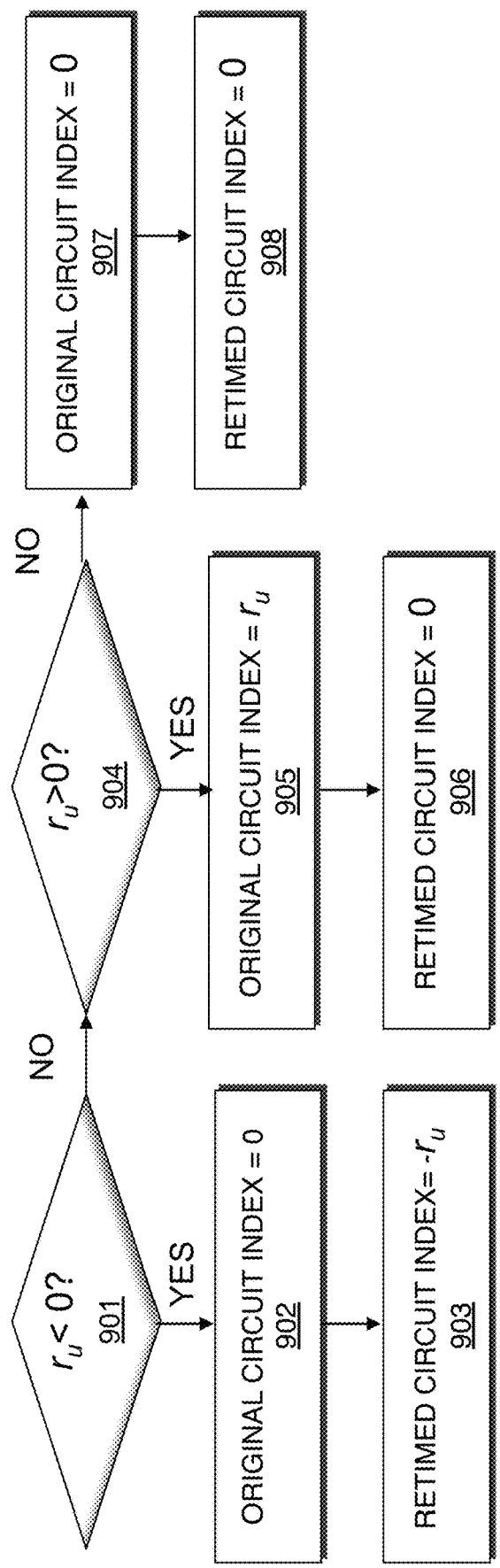
FIG. 9 is a flow chart illustrating a method for determining a left index for an edge in an original circuit and a retimed circuit according to an embodiment of the present disclosure.
Figure 10:
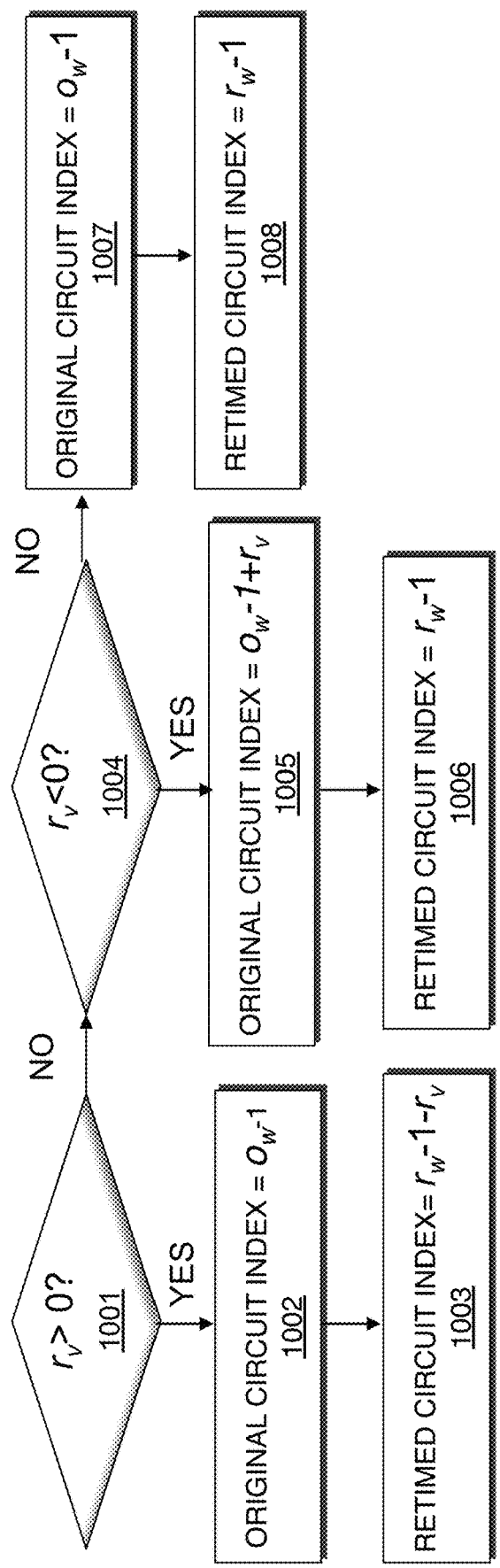
FIG. 10 is a flow chart illustrating a method for determining a right index for an edge in an original circuit and a retimed circuit according to an embodiment of the present disclosure.

At 805, the values for the indices of each edge are determined. According to an embodiment of the present disclosure, values for the indices are computed for edges that have a non-zero number of flip-flops in the original and retimed circuits (a non-zero value for the weights on its edge). FIGS. 9 and 10 illustrate exemplary methods for determining the values of indices on an edge.

At 806, it is determined whether all edges have been analyzed. If not all edges have been analyzed, control proceeds to 807 to analyze a next edge which has yet to be analyzed. If all edges have been analyzed, control proceeds to 812.

At 807, it is determined whether an unchanged flip-flop resides on a next edge. According to an embodiment of the present invention, an unchanged flip-flow is determined to reside on an edge if the following conditions are both true. First, the weights on the edge in the original circuit and the retimed circuit are both non-zero. This would mean that at least one flip-flop exists on the edge of the original and retimed circuits. Second, the left index $l_i$ is less than or equal to the right index $r_i$ in both the original and retimed circuit.

At 808, it is determined whether an unchanged flip-flop resides on the edge. If it is determined that an unchanged flip-flop does not reside on the edge, control returns to 806. If it is determined that an unchanged flip-flop resides on the edge, control proceeds to 809.

At 809, it is determined whether the initial states of the unchanged flip-flop(s) identified are equivalent. According to an embodiment of the present disclosure, the left and right indices for the edges determined at 805 identify the initial states of a range of one or more flip-flops that are unchanged in the original and retimed circuits. The values of the initial states as defined at 801, may be compared to determine whether the initial states of unchanged flip-flops are equivalent.

At 810, if the initial states of the unchanged flip-flop(s) identified are equivalent, control returns to 806. If the initial states of an unchanged flip-flop(s) identified are not equivalent, control proceeds to 811.

At 811, an indication is generated to indicate that verification of initial state equivalence of unchanged flip-flop(s) is unsuccessful. It should be appreciated that a message may also be generated to indicate the exact edge where the mismatch occurred.

At 812, an indication is generated to indicate that verification of equivalent initial states of changed flip-flop(s) is successful.

According to an embodiment of the present disclosure, after a determination that the initial states of the unchanged flip-flop(s) identified are not equivalent, control may return to 806 and continue to analyze all edges in the circuits. After the analysis is complete, an indication may be generated to indicate that verification of equivalent initial states of unchanged flip-flop(s) is unsuccessful. The identity of the edge(s) with unchanged flip-flop(s) with incorrect initial states and/or the identity of the flip-flop(s) with incorrect initial states may also be provided.

FIG. 9 is a flow chart illustrating a method for determining a left index for an edge in an original circuit and a retimed circuit according to an embodiment of the present disclosure. The method illustrated in FIG. 9 may be used to implement procedure 805 (shown in FIG. 8) in part. It should be appreciated that the method illustrated in FIG. 9 may be applied to determine a left index for each edge in an original circuit and a retimed circuit, where the edge has a source u and a destination v.

At 901, it is determined whether a value of a retiming label for a source of the edge is less than zero. If the value of the retiming label for the source of the edge is less than zero, control proceeds to 902. If value of the retiming label for the source of the edge is not less than zero, control proceeds to 904.

At 902, the left index for the edge in the original circuit is zero.

At 903, the left index for the edge in the retimed circuit is a negative value of the retiming label for the source of the edge.

At 904, it is determined whether the value of the retiming label for the source of the edge is greater than zero. If the value of the retiming label for the source of the edge is greater than zero, control proceeds to 905. If the value of the retiming label for the source of the edge is not greater than zero, then the value of the retiming label for the source of the edge must be equal to zero, and control proceeds to 907.

At 905, the left index for the edge in the original circuit is the value of the retiming label for the source of the edge.

At 906, the left index for the edge in the retimed circuit is zero.

At 907, the left index for the edge in the original circuit is zero

At 908, the left index for the edge in the retimed circuit is zero.

FIG. 10 is a flow chart illustrating a method for determining a right index for an edge in an original circuit and a retimed circuit according to an embodiment of the present disclosure. The method illustrated in FIG. 10 may be used to implement procedure 805 (shown in FIG. 8) in part. It should be appreciated that the method illustrated in FIG. 10 may be applied to determine a right index for each edge in an original (or initial) circuit and a retimed circuit, where the edge has a source u and a destination v.

At 1001, it is determined whether a value of a retiming label for a destination of the edge is greater than zero. If the value of the retiming label for the destination of the edge is greater than zero, control proceeds to 1002. If value of the retiming label for the source of the edge is not less than zero, control proceeds to 1004.

At 1002, the right index for the edge in an original circuit is a value of the weight for the edge in the original circuit minus one.

At 1003, the right index for the edge in a retimed circuit is a value of the weight for the edge in the retimed circuit minus one minus a value for the retiming label for the destination of the edge.

At 1004, it is determined whether the value of the retiming label for the destination of the edge is less than zero. If the value of the retiming label for the destination of the edge is less than zero, control proceeds to 1005. If the value of the retiming label for the destination of the edge is not less than zero, then the value of the retiming label for the destination of the edge must be equal to zero, and control proceeds to 1007.

At 1005, the right index for the edge in an original circuit, is the value of the weight for the edge in the original circuit minus one plus the value of the retiming label for the destination of the edge.

At 1006, the right index for the edge in the retimed circuit is the value of the weight for the edge in the retimed circuit minus one.

At 1007, the right index for the edge in an original circuit is the value of the weight for the edge in the original circuit minus one.

At 1008, the right index for the edge in the retimed circuit is a value of the weight for the edge in the retimed circuit minus one.

The following example illustrates how the verification method described with reference to FIGS. 4, and 8-10 may be performed on the sequential circuit illustrated in FIG. 2A and the retiming graph illustrated in FIG. 3 according to an embodiment of the present disclosure. SystemVerilog is used as the programming language in this example. It should be appreciated, however, that other programming languages or tools may be used to implement the methodology described.

With reference to FIG. 2A, references by arrays and variables to a letter and number refer to an input from the referenced letter at gate (component) with the referenced number. For example, arrays and variables with a1 in their names refer to the a input of gate G1. The primary output node O is modeled with array and variable names that include out.

With reference to FIG. 8, at 801, variables that model initial states of registers in an original circuit and a retimed circuit are declared. According to an embodiment of the present disclosure, the variables may be represented as static arrays for each edge in the original and retimed circuits. Referring to the sequential circuit 200 in FIG. 2A and its corresponding retiming graph 300 in FIG. 3, the size of the arrays for each edge in the retiming graph 300 is set as the weight of that edge in the graph. If the weight is 0, a dummy array of size 1 may be created. For example, for an edge to a1, the following array may be declared.

bit o_ff_a1[1]; //Edge to a1 in original circuit has 1 flip-flop

Similarly, for an edge to b4, the following array may be declared.

bit o_ff_b4[2]; //Edge to b4 in original circuit has 2 flip-flops

An array identifying the initial states of registers for all edges in the original sequential circuit 200 in FIG. 2A, and the retimed sequential circuit 200" in FIG. 2C may be declared as follows. We use the "o_" prefix to refer to variables in the original circuit and the "r_" prefix for variables in the retimed circuit.

bit o_ff_a1[1];
    bit o_ff_b1[1];
    bit o_ff_a2[1];
    bit o_ff_b2[1];
    bit o_ff_a3[1];
    bit o_ff_b3[1];
    bit o_ff_a4[1];
    bit o_ff_b4[2];
    bit o_ff_a5[1];
    bit o_ff_b5[2];
    bit o_ff_a6[1];
    bit o_ff_b6[1];
    bit o_ff_out[1];
    bit r_ff_a1[1];
    bit r_ff_b1[1];
    bit r_ff_a2[1];
    bit r_ff_b2[1];
    bit r_ff_a3[1];
    bit r_ff_b3[1];
    bit r_ff_a4[1];
    bit r_ff_b4[1];
    bit r_ff_a5[1];
    bit r_ff_b5[1];
    bit r_ff_a6[1];
    bit r_ff_b6[1];
    bit r_ff_out[1];

According to an embodiment of the disclosure, defining variables that model initial states of registers in an original circuit and a retimed circuit may include initializing the variables as shown below.

```
task set initial values( );
  //Initial power-up
  o_ff_a1[O]=1;
  o_ff_b1[O]=1;
  o_ff_a2[O]=1;
  o_ff_b2[O]=1;
  o_ff_b4[O]=0;
  o_ff_b4[1]=0;
  o_ff_b5[0]=0;
  o_ff_b5[1]=0;
  o_ff_out[0]=0;
  r_ff_a4[0]=1;
  r_ff_b4[0]=0;
  r_ff_a5[0]=1;
  r_ff_b5[0]=0;
  r_ff_a6[0]=1;
  r_ff_b6[0]=0;
```

At 802, variables that model weights in the initial circuit and the retimed circuit are declared. Variables representing the weights for all edges in the original sequential circuit 200 and the retimed sequential circuit 200" may be declared as follows.

```
integer o_wa1, o_wb1, o_wa2, o_wb2, o_wa3, o_wb3,
    o_wa4, o_wb4, o_wa5, o_wb5, o_wa6, o_wb6,
    o_wout;
integer r_wa1, r_wb1, r_wa2, r_wb2, r_wa3, r_wb3,
    r_wa4, r_wb4, r_wa5, r_wb5, r_wa6, r_wb6, r_wout;
```

According to an embodiment of the disclosure, defining variables that model weights in an original circuit and a retimed circuit may include initializing the variables as shown below.

```
task set weights(rewind structural constraints bar);
  //New weights represents the weights in the original
      circuit
  o_wa1=bar.new_wa1;
  o_wb1=bar.new_wb1;
  o_wa2=bar.new_wa2;
  o_wb2=bar.new_wb2;
  o_wa3=bar.new_wa3;
  o_wb3=bar.new_wb3;
  o_wa4=bar.new_wa4;
  o_wb4=bar.new_wb4;
  o_wa5=bar.new_wa5;
  o_wb5=bar.new_wb5;
  o_wa6=bar.new_wa6;
  o_wb6=bar.new_wb6;
  o_wout=bar.new_wout;
  //Current weights represents the weights in the retimed
      circuit
  r_wa1=bar.wa1;
  r_wb1=bar.wb1;
  r_wa2=bar.wa2;
  r_wb2=bar.wb2;
  r_wa3=bar.wa3;
  r_wb3=bar.wb3;
  r_wa4=bar.wa4;
  r_wb4=bar.wb4;
  r_wa5=bar.wa5;
  r_wb5=bar.wb5;
  r_wa6=bar.wa6;
  r_wb6=bar.wb6;
  r_wout=bar.wout;
endtask
```

At 803, variables that model retiming labels are declared. The values for the retiming labels are known after verification of structural correctness and may be declared as follows.

```
integer r1, r2, r3, r4, r5, r6, rin1, rin2, rout;
```

The retiming labels computed from structural verification may be negated to derive true retiming labels to transform the original circuit to a retimed circuit. According to an embodiment of the disclosure, defining variables that model retiming labels may include initializing the variables as shown below.

```
task set_rs(foo bar);
  //Negate the values of r, to get the
  //real value that the retimer implemented
  r1=-bar.r1;
  r2=-bar.r2;
  r3=-bar.r3;
  r4=-bar.r4;
  r5=-bar.r5;
  r6=-bar.r6;
  rin1=bar.rin1;
  rin2=bar.rin2;
  rout=bar.rout;
endtask
```

At 804, variables that model indices that identify unchanged registers are declared. Variables representing the indices for all edges in the original sequential circuit 200 and the retimed sequential circuit 200" may be declared as follows.

```
integer o_a1_li, o_a1_ri, o_b1_li,
  o_b1_ri, o_a2_li, o_a2_ri, o_b2_li, o_b2_ri,
  o_a3_li, o_a3_ri, o_b3_li, o_b3_ri, o_a4_li,
  o_a4_ri, o_b4_li, o_b4_ri, o_a5_li, o_a5_ri,
  o_b5_li, o_b5_ri, o_a6_li, o_a6_ri, o_b6_li,
  o_b6_ri, o_out_li, o_out_ri;
integer r_a1_li, r_a1_ri, r_b1_li,
  r_b1_ri, r_a2_li, r_a2_ri, r_b2_li, r_b2_ri,
  r_a3_li, r_a3_ri, r_b3_li, r_b3_ri, r_a4_li,
  r_a4_ri, r_b4_li, r_b4_ri, r_a5_li, r_a5_ri,
  r_b5_li, r_b5_ri, r_a6_li, r_a6_ri, r_b6_li,
  r_b6_ri, r_out_li, r_out_ri;
```

According to an embodiment of the disclosure, defining variables that model indices in an initial circuit and a retimed circuit may include initializing the variables as shown below. For example, every left index may initially be set to −1 and every right index may initially be set to −2. The initialization of indices ensures that the right index is less than the left index on an edge in the event that no flip-flops reside on the edge.

At 805, the values for the indices of each edge are determined. According to an embodiment of the present disclosure, in order to determine the indices for the edge corresponding to the a input into gate G3, the following operations may be performed.

```
if (o_wa3 > 0 && r_wa3 > 0) begin
  if (r1 > 0) begin
    o_a3_li = r1;
    r_a3_li = 0;
  end
  else if (r1 < 0) begin
    o_a3_li = 0;
    r_a3_li = -r1;
  end
  else begin
    o_a3_li = 0;
    r_a3_li = 0;
```

```
    end
    if (r3 > 0) begin
        o_a3_ri = o_wa3 - 1;
        r_a3_ri = r_wa3 - 1 - r3;
    end
    else if (r3 < 0) begin
        o_a3_ri = o_wa3 - 1 + r3;
        r_a3_ri = r_wa3 - 1;
    end
    else begin
        o_a3_ri = o_wa3 - 1;
        r_a3_ri = r_wa3 - 1;
    end
end
```

It should be appreciated that the operations similar to those illustrated above may be used to determine the indices of other edges in the original sequential circuit 200 and the retimed sequential circuit 200".

At 806, it is determined whether all edges have been analyzed. If all edges have not been analyzed, control proceeds to 807 to analyze a next edge which has yet to be analyzed. If all edges have been analyzed, control proceeds to 812.

At 807, it is determined whether an unchanged flip-flop resides on a next edge. According to an embodiment of the present invention, an unchanged flip-flow is determined to reside on an edge if the following conditions are both true. First, the weights on the edge in the original circuit and the retimed circuit are both non-zero. This would mean that at least one flip-flop exists on the edge of the original and retimed circuits. Second, the left index $l_i$ is less than or equal to the right index $r_i$ in both the original and retimed circuit.

At 808, it is determined whether an unchanged flip-flop resides on the edge. If it is determined that an unchanged flip-flop does not reside on the edge, control returns to 806. If it is determined that an unchanged flip-flop resides on the edge, control proceeds to 809.

At 809, it is determined whether the initial states of the unchanged flip-flop(s) identified are equivalent. According to an embodiment of the present disclosure, the left and right indices for the edges determined at 804 identify the initial states of a range of one or more flip-flops that are unchanged in the original and retimed circuits. The values of the initial states as defined at 801, may be compared to determine whether the initial states of unchanged flip-flops are equivalent. This may be achieved by iterating through all the elements between the left index and the right index (inclusively) of the initial state values array for the edge in the original circuit, and comparing the corresponding initial state value in the initial state values array for the edge in the retimed circuit. An array lookup procedure may be utilized using the indices in the arrays of initial state values in the original and retimed circuits At 810, if the initial states of the unchanged flip-flop(s) identified are equivalent, control returns to 806. If the initial states of an unchanged flip-flop(s) identified are not equivalent, control proceeds to 811.

At 811, an indication is generated to indicate that verification of initial state equivalence of unchanged flip-flop(s) is unsuccessful. A message is also generated with the exact edge where the mismatch occurred.

At 812, an indication is generated to indicate that verification of equivalent initial states of changed flip-flop(s) is successful. According to an embodiment of the present disclosure, the following exemplary function may be used to indicate verification of equivalent initial states of changed flip-flop(s). The exemplary function applies for edge a3 from G1 to G3.

```
if (o_wa3 > 0 && r_wa3 > 0 && o_a3_li <= o_a3_ri &&
    r_a3_li <= r_a3_ri) begin
    count = 0;
    for (i = o_a3_li; i <= o_a3_ri; i++, count++) begin
        if (o_ff_a3[i] != r_ff_a3[r_a3_li+count]) begin
            $write("Verification Error: Unchanged initial states
for connection a3 do not match");
            return 0;
        end
    end
end
```

It should be appreciated that the array iteration illustrated above may be performed for all edges in the circuit. The function illustrated above ensures that there a non-zero number of flip-flops are on the edge in the original and retimed circuits, and that the left index is less than the right index in the original and retimed circuits. The function iterates the original circuit array between these indices and compares the corresponding values in the retimed array of values.

According to an embodiment of the present disclosure, results generated from verifying structural correctness of a retimed circuit may also be used to determine whether initial state computations for changed flip-flops are performed correctly. The retiming labels identified from performing structural verification may be used to determine which signals in the original and retimed circuits correspond to each other and appropriate compare points may be created to sequentially verify these signals. Bounded sequential logic simulation may also be performed using the results of the structural verification to determine the maximum number of time frames in which to verify the signals.

Figure 11:
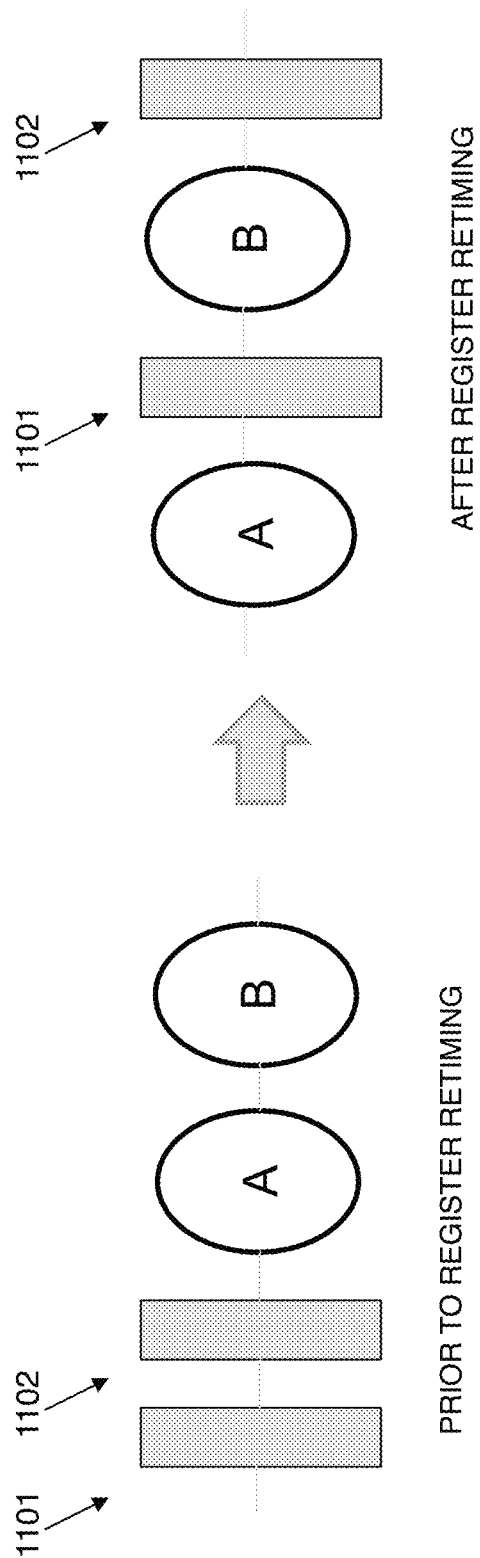
FIG. 11 illustrates an example of changed flip-flops after register retiming according to an exemplary embodiment of the present disclosure.

FIG. 11 illustrates an example of changed flip-flops after register retiming according to an exemplary embodiment of the present disclosure. In this example, A and B are combinational logic elements. Register retiming repositions flip-flops 1101 and 1102. The initial states of flip-flops 1101 and 1102 in the retimed circuit may be computed using the initial states of the flip-flops in the original circuit and the Boolean functionality of the combinational logic elements A and B. According to an embodiment of the present disclosure, verification may be performed to confirm that the initial states of the changed (repositioned) flip-flops 1101 and 1102 are correct.

Figure 12:
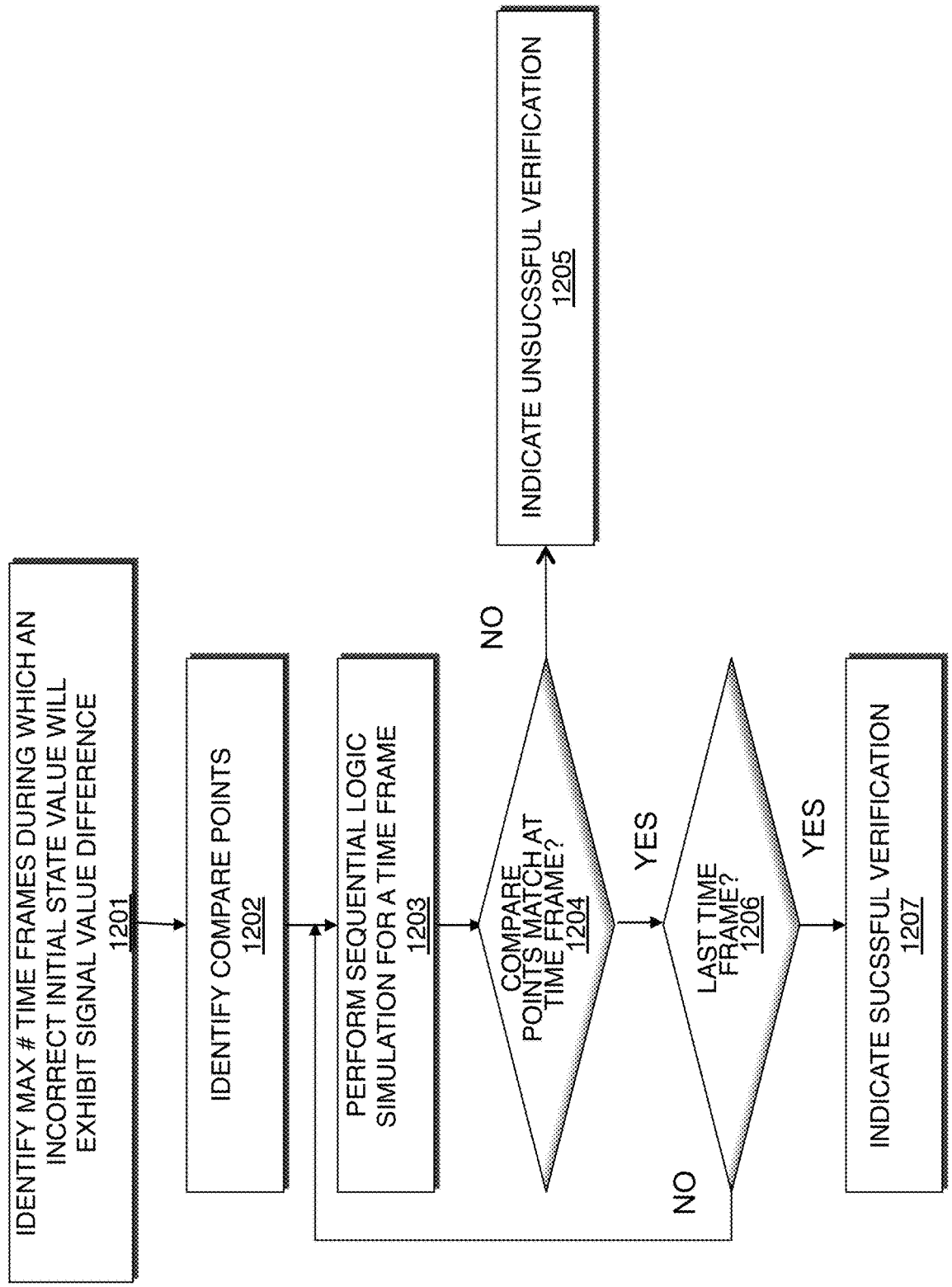
FIG. 12 is a flow chart illustrating a method for verifying initial state equivalence of changed flip-flops in a retimed circuit according to an embodiment of the present disclosure.

One important part of the verification procedure is identifying appropriate signals to compare that should produce the same logic value for multiple time frames during simulation. For example, in FIG. 11, signals x and y should match for two time frames if the initial states in the retimed circuit were computed correctly. The maximum value of the retiming labels computed for structural verification is used as the number of time frames required for simulation. Any incorrect initial state computation will arise as compare point value mismatches when simulating within these number of time frames, starting from the initial states of the original and retimed circuits FIG. 12 is a flow chart illustrating a method for verifying initial state equivalence of changed flip-flops in a retimed circuit according to an embodiment of the present disclosure. The procedures illustrated in FIG. 12 may be used to implement procedure 450 (shown in FIG. 4).

At 1201, a maximum number of time frames which reflects a possible variation in functional behavior because of incorrect computation of initial states of changed flip-flops in a retimed circuit is identified. The number of time frames identified determines the upper bound of time frames for which bounded sequential logic simulation should be performed in order to determine whether the initial states of changed flip-flops in the retimed circuit were correctly computed. According to an embodiment of the present disclosure, the maximum absolute value of the retiming labels for the circuit (computed during structural verification) is identified as the number of time frames during which a variation in functional behavior of the circuit caused by incorrect computation of initial states of the changed flip-flops may be exhibited. Any incorrect initial state computation may exhibit a difference in signal values of compare points, when simulating within these number of time frames.

At 1202, compare points are identified. The compare points represent corresponding points from the original and retimed circuit where signal values should be equivalent if the initial states of changed flip-flops were correctly computed. According to an embodiment of the present disclosure, the retiming labels for the circuit (determined during structural verification) are used to identify the compare points.

For a retiming label, r, with a positive value, a compare point in the original circuit is at an output of the node associated with the retiming label, and a corresponding compare point in the retimed circuit is at the output of the $r^{th}$ flip-flop on the output of the node as indicated by the retiming label. For a retiming label, r, with a negative value, a compare point in the retimed circuit is at an output of the node associated with the retiming label, and a corresponding compare point in the original circuit is at the output of the $r^{th}$ flip-flop at the output of the node indicated by the retiming label.

At 1203, sequential logic simulation is performed for a time frame. Given the known initial states of the flip-flops in the original and retimed circuits, sequential logic simulation is performed where signal values are identified at compare points of the circuits at a first initial time frame. This bounded sequential logic simulation uses 3-valued simulation using ({0, 1, X} values, where X represents an unknown value. It should be appreciated that procedure 1203 may performed for subsequent time frames.

At 1204, it is determined whether the values of the compare points in the retimed circuit match the values of the corresponding compare points in the original circuit. According to an embodiment of the present disclosure, compare points in the retimed circuit match compare points at the original circuit if a signal value at the compare points of the retimed circuit match a signal value at corresponding compare points of the original circuit. If the compare points at the retimed circuits do not match the compare points at the original circuit, control proceeds to 1205. If the compare points at the retimed circuits match the compare points at the original circuit, control proceeds to 1206.

At 1205, an indication is generated that verification of initial states of changed flip-flops was unsuccessful, and the mismatching compare points and the time-frame where the mismatches occurred is also generated At 1206, it is determined whether the compare points that were previously compared were at a last time frame for the bounded sequential logic simulation. According to an embodiment of the present disclosure, sequential logic simulation is bounded by the number of time frames identified at 1201. If the compare points that were previously compared were not at the last time frame for the bounded sequential logic simulation, control proceeds to 1203 where sequential simulation is performed for a next time frame. This involves a clocking operation that transfers the values from the D signal of every flip-flop to the Q signal of the same flip-flop. If the compare points that were previously compared were at the last time frame for the bounded sequential logic simulation, control proceeds to 1207.

At 1207, an indication is generated that verification of initial states of changed flip-flops was successful.

It should be appreciated that the methodology for verifying initial state equivalence of changed flip-flops in a retimed circuit as shown in FIG. 12 may be implemented using various techniques. For example, D and Q values for each flip-flop in the retimed circuit and the original circuit may be defined as random variables to be solved where signal values at identified compare points in the retimed circuit and original circuit are constrained to be equal. If a solution can be found for the D and Q values for each of the flip-flops in the retimed circuit and the original circuit given the defined constraints, verification of initial state equivalence of changed flip-flops in the retimed circuit is successful.

FIG. 13 is a flow chart illustrating a method for identifying compare points and performing bounded sequential logic simulation according to an embodiment of the present disclosure. The procedures illustrated in FIG. 13 may be used to implement procedures 1202-1207 (shown in FIG. 12). It should be appreciated that prior to performing the procedures in FIG. 13, a first retiming graph is generated from an HDL description of an original circuit and a second flow chart is generated from an HDL description of a retimed circuit. According to an embodiment of the present disclosure, the retiming graphs model combinational nodes as vertices with weights on edges representing a number of flip-flops between corresponding combinational nodes represented by that edge. The first and second retiming graphs may be traversed, and constraints may be generated and solved in the manner described as follows. The initial state values from the original and retimed circuits are also utilized.

At 1301, a first set of state variables is defined. The first set of state variables models initial states (initial values) of primary inputs and flip-flops in the original circuit and the retimed circuit. According to an embodiment of the present disclosure, flip-flops on an output edge of each combinational node that are common to all the fanouts of the combinational element output edge may be represented in a static array. Flip-flops that are not common to all the fanouts of a combinational node output edge may be represented as a separate state variables.

At 1302, a second set of state variables is defined. The second set of state variables models retiming labels. According to an embodiment of the present disclosure, an absolute value of the retiming labels may also be defined. The retiming labels defined at 1302 may be the retiming labels computed at FIG. 5 during structural verification.

At 1303, a first set of random variables is defined. The first set of random variables model D and Q values of the flip-flops in the original circuit and the retimed circuit. According to an embodiment of the present disclosure, the random variables may be represented as static arrays or individual variables. A dummy array of size 1 may be created for edges in the circuits that do not have any flip-flops.

At 1304, a second set of random variables is defined. The second set of random variables models values at an input and output of each combinational node in the original and retimed circuit.

At 1305, a third set of random variables is defined. According to an embodiment of the present disclosure, index variables are declared for each combinational node that indexes into arrays representing values of flip-flops on an output of each of the combinational node.

At 1306, constraints are defined. According to an embodiment of the present disclosure, a first set of constraints is defined to enable logic simulation. The first set of constraints includes constraints that transfer values to the D and Q random variables from initial states, combinational elements, or primary inputs driving the flip-flops. The first set of constraints also ensures that combinational node values are computed before the values are transferred. Constraints for the combinational nodes also transfer values from a previous node in the circuits and compute an output value for each combinational node using input values and Boolean functionality of the node. Ordering constraints may also be defined to ensure that computation proceeds in a topological ordering where all inputs of a combinational element are computed before the output is computed. According to an embodiment of the present disclosure, a second set of constraints is defined to identify compare points corresponding to signals in the output of every combinational node in the original circuit and retimed circuit. Using the retiming label for each node, constraints appropriately compare combinational node output values to corresponding flip-flop values.

At 1307, solutions for the random variables are sought. According to an embodiment of the present disclosure, values for the random variables are solved for given the state variables and constraints defined. Solutions for the random variables may be computed using an equation solving routine or program.

At 1308, it is determined whether a solution for the random values is found. If a solution for the random variables is found, control proceeds to 1309. This is the case when the constraints for all the compare points are satisfied for the current time frame. If a solution for the random variables is not found, control proceeds to 1312.

At 1309, it is determined whether the solution for the random variables found were for a last time frame for bounded sequential logic simulation. According to an embodiment of the present disclosure, sequential logic simulation is bounded by a number of time frames identified by a maximum absolute value of retiming labels for the system computed during structural verification. If the solution for the random variables found were not for the last time frame for the bounded sequential logic simulation, control proceeds to 1310. If the solution for the random variables found were for the last time frame for the bounded sequential logic simulation, control proceeds to 1311.

At 1310, a clock operation is performed to move data across time frames. The clocking operation transfers the D values on flip-flops of the original circuit and the retimed circuit to the Q values which results in entering a new time frame. According to an embodiment of the present disclosure, three sets of values are used. In this embodiment, a D values are moved to I values. I values are moved to Q values. This technique allows for uniform treatment of initial state values and values of flip-flops between time frames. Essentially, a D value becomes the initial state, I value, for the next time frame. The constraints themselves ensure that the Q value in a time frame is equal to the initial state, I value, for that time frame.

At 1311, an indication is generated that verification of initial states of changed flip-flops was successful.

At 1312, an indication is generated that verification of initial states of changed flip-flops was unsuccessful.

The following example illustrates how the verification method described with reference to FIGS. 4, and 12-13 may be performed on the sequential circuit illustrated in FIG. 2A and the retiming graph illustrated in FIG. 3 according to an embodiment of the present disclosure. SystemVerilog is used as the programming language in this example. It should be appreciated, however, that other programming languages or tools may be used to implement the methodology described.

With reference to FIG. 2A, references by arrays and variables to a letter and number refer to an input from the referenced letter at gate (component) with the referenced number. For example, arrays and variables with a1 in their names refer to the a input of gate G1. The primary output node O is modeled with array and variable names that include out.

With reference to FIG. 13, at 1301, a first set of state variables is defined to model initial states (initial values) of primary inputs and flip-flops in the original circuit and the retimed circuit. At 1302, a second set of state variables is defined to models retiming labels and an absolute value of the retiming labels. These state variables may be declared as follows.

```
//ORIGINAL CIRCUIT INITIAL STATE VARIABLES
bit[1:0] o_in1, o_in2;
//FF initial states
bit[1:0] o_in1_ff_i[1];
bit[1:0] o_in2_ff_i[1];
bit[1:0] o_z6_ff_i[1];
//FF 4 is not common to all fanouts of gate 6, so
have a separate variable
bit[1:0] o_i3;
//RETIMED CIRCUIT INITIAL STATE VARIABLES
//Input/outputs
bit[1:0] r_in1, r_in2;
//FF initial states
bit[1:0] r_z3_ff_i[1];
bit[1:0] r_z4_ff_i[1];
bit[1:0] r_z5_ff_i[1];
//FF 4 is not common to all fanouts of gate 6, so
have a separate variable
bit[1:0] r_i3;
integer r1, r2, r3, r4, r5, r6;
integer a_r1, a_r2, a_r3, a_r4, a_r5, a_r6;
```
The state variables may be initialized as follows.
```
task init state variables( );
  //Original circuit
  o_in1=2;
  o_in2=2;
  o_in1_ff_i[0]=1;
  o_in2_ff_i[0]=1;
  o_z6_ff_i[0]=0;
  o_i3=0;
  //Retimed circuit
  r_in1=2;
  r_in2=2;
  r_z3_ff_i[0]=1;
  r_z4_ff_i[0]=1;
  r_z5_ff_i[0]=0;
  r_i3=0;
```

```
      r1=0;
      r2=0;
      r3=0;
      r4=0;
      r5=0;
      r6=0;
      a_r1=0;
      a_r2=0;
      a_r3=0;
      a_r4=0;
      a_r5=0;
      a_r6=0;
  endtask
  task init_rs(foo bar);
      r1=bar.r1;
      r2=bar.r2;
      r3=bar.r3;
      r4=bar.r4;
      r5=bar.r5;
      r6=bar.r6;
      //Also store absolute values, for easy indexing later
      a_r1=(r1>=0)?r1:-r1;
      a_r2=(r2>=0)?r2:-r2;
      a_r3=(r3>=0)?r3:-r3;
      a_r4=(r4>=0)?r4:-r4;
      a_r5=(r5>=0)?r5:-r5;
      a_r6=(r6>=0)?r6:-r6;
  endtask
```

At 1303, a first set of random variables is defined to model D and Q values of the flip-flops in the original circuit and the retimed circuit. At 1304, a second set of random variables is defined to model values at inputs and output of each combinational node in the original and retimed circuit. At 1305, a third set of random variables is defined that model index variables for each combinational node that indexes into arrays representing values of flip-flops on an output of each of the combinational node. These state variables may be declared as follows.

```
  //ORIGINAL CIRCUIT RANDOM VARIABLES
      //FF input/outputs
      //FFs that are common to all fanouts of a gate are
          modeled as array variables;
      //all other FFs that are specific to each fanout need to
          be modeled separately
      //as independent random variables.
      rand bit[1:0] o_in1_ff_d[1];
      rand bit[1:0] o_in1_ff_q[1];
      rand bit[1:0] o_in2_ff_d[1];
      rand bit[1:0] o_in2_ff_q[1];
      rand bit[1:0] o_z6_ff_d[1];
      rand bit[1:0] o_z6_ff_q[1];
      rand bit[1:0] o_d3, o_q3;
      //Dummy arrays for nodes that don't have flip-flops
      rand bit[1:0] o_z1_ff_q[1];
      rand bit[1:0] o_z2_ff_q[1];
      rand bit[1:0] o_z3_ff_q[1];
      rand bit[1:0] o_z4_ff_q[1];
      rand bit[1:0] o_z5_ff_q[1];
      //Combinational logic
      rand bit[1:0] o_a1, o_b1, o_z1, o_a2, o_b2, o_z2, o_a3,
          o_b3, o_z3, o_a4, o_b4, o_z4, o_a5, o_b5, o_z5,
          o_a6, o_b6, o_z6;
  //RETIMED CIRCUIT RANDOM VARIABLES
      //FF input/outputs
      //FFs that are common to all fanouts of a gate are
          modeled as array variables;
      //all other FFs that are specific to each fanout need to
          be modeled separately
      //as independent random variables.
      rand bit[1:0] r_z3_ff_d[1];
      rand bit[1:0] r_z3_ff_q[1];
      rand bit[1:0] r_z4_ff_d[1];
      rand bit[1:0] r_z4_ff_q[1];
      rand bit[1:0] r_z5_ff_d[1];
      rand bit[1:0] r_z5_ff_q[1];
      rand bit[1:0] r_d3, r_q3
      //Dummy arrays for nodes that don't have flip-flops
      rand bit[1:0] r_z1_ff_q[1];
      rand bit[1:0] r_z2_ff_q[1];
      rand bit[1:0] r_z6_ff_q[1];
      //Combinational logic
      rand bit[1:0] r_a1, r_b1, r_z1, r_a2, r_b2, r_z2, r_a3,
          r_b3, r_z3, r_a4, r_b4, r_z4, r_a5, r_b5, r_z5, r_a6,
          r_b6, r_z6;
      //INDEX RANDOM VARIABLES
      rand integer r1_index, r2_index, r3_index, r4_index, r5
          _index, r6_index;
```

At 1306, constraints are defined. According to an embodiment of the present disclosure, a first set of constraints is defined to enable logic simulation, and a second set of constraints is defined to identify compare points corresponding to signals in the output of every combinational node in the original circuit and retimed circuit. The constraints may be defined as follows.

```
  // ORIGINAL CIRCUIT CONSTRAINTS
      constraint o_ffs {
          foreach(o_in1_ff_q[i]) {
              o_in1_ff_q[i] == o_in1_ff_i[i];
          }
          foreach(o_in2_ff_q[i]) {
              o_in2_ff_q[i] == o_in2_ff_i[i];
          }
          foreach(o_z6_ff_q[i]) {
              o_z6_ff_q[i] == o_z6_ff_i[i];
          }
          o_q3 == o_i3;
          o_in1_ff_d[0] == o_in1;
          o_in2_ff_d[0] == o_in2;
          o_z6_ff_d[0] == o_z6;
          solve o_z6 before o_z6_ff_d[0];
          o_d3 == o_z6_ff_q[0];
      }
      constraint o_gate1 {
          o_a1 == o_in1_ff_q[0];
          o_b1 == o_in2_ff_q[0];
          o_z1 == (o_a1 & o_b1);
          solve o_a1, o_b1 before o_z1;
      }
      constraint o_gate2 {
          o_a2 == o_in1_ff_q[0];
          o_b2 == o_in2_ff_q[0];
          o_z2 == (o_a2 & o_b2);
          solve o_a2, o_b2 before o_z2;
      }
      constraint o_gate3 {
          o_a3 == o_z1;
          o_b3 == o_z2;
          o_z3 == (o_a3 & o_b3);
          solve o_z1 before o_a3;
          solve o_z2 before o_b3;
          solve o_a3, o_b3 before o_z3;
      }
      constraint o_gate4 {
          o_a4 == o_z3;
          o_b4 == o_q3;
          o_z4 == (o_a4 & o_b4);
          solve o_z3 before o_a4;
          solve o_a4, o_b4 before o_z4;
      }
```

```
constraint o_gate5 {
  o_a5 == o_z3;
  o_b5 == o_q3;
  o_z5 == (o_a5 & o_b5);
  solve o_z3 before o_a5;
  solve o_a5, o_b5 before o_z5;
}
constraint o_gate6 {
  o_a6 == o_z4;
  o_b6 == o_z5;
  o_z6 == (o_a6 & o_b6);
  solve o_z4 before o_a6;
  solve o_z5 before o_b6;
  solve o_a6, o_b6 before o_z6;
}
constraint o_outputs {
  o_zout == o_z6_ff_q[0];
}
// RETIMED CIRCUIT CONSTRAINTS
constraint r_ffs {
  r_z3_ff_q == r_z3_ff_i[0];
  r_z4_ff_q == r_z4_ff_i[0];
  r_z5_ff_q == r_z5_ff_i[0];
  r_q3 == r_i3;
  r_z3_ff_d[0] == r_z3;
  solve r_z3 before r_z3_ff_d[0];
  r_z4_ff_d[0] == r_z4;
  solve r_z4 before r_z4_ff_d[0];
  r_z5_ff_d[0] == r_z5;
  solve r_z5 before r_z5_ff_d[0];
  r_d3 == r_z6;
  solve r_z6 before r_d3;
}
constraint r_gate1 {
  r_a1 == r_in1;
  r_b1 == r_in2;
  r_z1 == (r_a1 & r_b1);
  solve r_a1, r_b1 before r_z1;
}
constraint r_gate2 {
  r_a2 == r_in1;
  r_b2 == r_in2;
  r_z2 == (r_a2 & r_b2);
  solve r_a2, r_b2 before r_z2;
}
constraint r_gate3 {
  r_a3 == r_z1;
  r_b3 == r_z2;
  solve r_z1 before r_a3;
  solve r_z2 before r_b3;
  r_z3 == (r_a3 & r_b3);
  solve r_a3, r_b3 before r_z3;
}
constraint r_gate4 {
  r_a4 == r_z3_ff_q[0];
  r_b4 == r_q3;
  r_z4 == (r_a4 & r_b4);
  solve r_a4, r_b4 before r_z4;
}
constraint r_gate5 {
  r_a5 == r_z3_ff_q[0];
  r_b5 == r_q3;
  r_z5 == (r_a5 & r_b5);
  solve r_a5, r_b5 before r_z5;
}
constraint r_gate6 {
  r_a6 == r_z4_ff_q[0];
  r_b6 == r_z5_ff_q[0];
  r_z6 == (r_a6 & r_b6);
  solve r_a6, r_b6 before r_z6;
}
constraint r_outputs {
  r_zout == r_z6;
  solve r_z6 before r_zout;
}
// Constraints for all outputs of original and
retimed circuits
constraint mitre {
  if (r1 > 0) {
    r1_index == r1 - 1;
    if (r_z1_ff_q.size( ) >= r1) {
      foreach(r_z1_ff_q[i]) {
        if (i == r1_index) {
          r_z1_ff_q[i] == o_z1;
        }
      }
    }
  }
  else if (r1 < 0) {
    r1_index == a_r1 - 1;
    if (o_z1_ff_q.size( ) >= a_r1) {
      foreach(o_z1_ff_q[i]) {
        if (i == r1_index) {
          o_z1_ff_q[i] == r_z1;
        }
      }
    }
  }
  if (r2 > 0) {
    r2_index == r2 - 1;
    if (r_z2_ff_q.size( ) >= r2) {
      foreach(r_z2_ff_q[i]) {
        if (i == r2_index) {
          r_z2_ff_q[i] == o_z2;
        }
      }
    }
  }
  else if (r2 < 0) {
    r2_index == a_r2 - 1;
    if (o_z2_ff_q.size( ) >= a_r2) {
      foreach(o_z2_ff_q[i]) {
        if (i == r2_index) {
          o_z2_ff_q[i] == r_z2;
        }
      }
    }
  }
  if (r3 > 0) {
    r3_index == r3 - 1;
    if (r_z3_ff_q.size( ) >= r3) {
      foreach(r_z3_ff_q[i]) {
        if (i == r3_index) {
          r_z3_ff_q[i] == o_z3;
        }
      }
    }
  }
  else if (r3 < 0) {
    r3_index == a_r3 - 1;
    if (o_z3_ff_q.size( ) >= a_r3) {
      foreach(o_z3_ff_q[i]) {
        if (i == r3_index) {
          o_z3_ff_q[i] == r_z3;
        }
      }
    }
  }
  if (r4 > 0) {
    r4_index == r4 - 1;
    if (r_z4_ff_q.size( ) >= r4) {
      foreach(r_z4_ff_q[i]) {
        if (i == r4_index) {
          r_z4_ff_q[i] == o_z4;
        }
      }
    }
  }
  else if (r4 < 0) {
    r4_index == a_r4 - 1;
    if (o_z4_ff_q.size( ) >= a_r4) {
      foreach(o_z4_ff_q[i]) {
        if (i == r4_index) {
          o_z4_ff_q[i] == r_z4;
        }
      }
    }
  }
```

```
        if (r5 > 0) {
            r5_index == r5 - 1;
            if (r_z5_ff_q.size( ) >= r5) {
                foreach(r_z5_ff_q[i]) {
                    if (i == r5_index) {
                        r_z5_ff_q[i] == o_z5;
                    }
                }
            }
        }
        else if (r5 < 0) {
            r5_index == a_r5 - 1;
            if (o_z5_ff_q.size( ) >= a_r5) {
                foreach(o_z5_ff_q[i]) {
                    if (i == r5_index) {
                        o_z5_ff_q[i] == r_z5;
                    }
                }
            }
        }
        if (r6 > 0) {
            r6_index == r6 - 1;
            if (r_z6_ff_q.size( ) >= r6) {
                foreach(r_z6_ff_q[i]) {
                    if (i == r6_index) {
                        r_z6_ff_q[i] == o_z6;
                    }
                }
            }
        }
        else if (r6 < 0) {
            r6_index == a_r6 - 1;
            if (o_z6_ff_q.size( ) >= a_r6) {
                foreach(o_z6_ff_q[i]) {
                    if (i == r6_index) {
                        o_z6_ff_q[i] == r_z6;
                    }
                }
            }
        }
    }
```

The exemplary constraint blocks illustrated above perform the following operations. For each combinational gate (node), a determination is made as to whether a structural verifier required any moves of flip-flops across the node. A non-zero retiming label on a node reflects that some flip-flop movement across the node was required to retime the retimed circuit back to the original circuit. If the retiming label has a positive value, the retimer moved that number of flip-flops from the inputs of the node to the output of the node. In such a case, if those flip-flops are still in the output of the node in the retimed circuit (because they did not get further forward retimed), a compare point may be derived that corresponds to the rth flip-flop on the output of the node in the retimed circuit and the output node in the original circuit. If the retiming label has a negative value, the retimer moved that number of flip-flops from the output of the node in the original circuit to its inputs. In such a case, if the original circuit had r flip-flops on the output of the node, a compare point may be derived that corresponds to the output of the node in the retimed circuit and the signal corresponding to the rth flip-flop on the output of the original circuit.

At 1307, solutions for the random variables are sought. According to an embodiment of the present disclosure, values for the random variables are solved for given the state variables and constraints defined. Solutions for the random variables may be computed using an equation solving routine or program.

At 1308, if a solution for the random variables is found control proceeds to 1309. This represents the case when all compare point constraints are satisfied for the current time frame. This means the values of compare points are consistent in the current time frame. If a solution for the random variables is not found, control proceeds to 1312.

At 1309, it is determined whether the solution for the random variables found were for a last time frame for bounded sequential logic simulation. According to an embodiment of the present disclosure, sequential logic simulation is bounded by a number of time frames identified by a maximum absolute value of retiming labels for the system. If the solution for the random variables found were not for the last time frame for the bounded sequential logic simulation, control proceeds to 1310. If the solution for the random variables found were for the last time frame for the bounded sequential logic simulation, control proceeds to 1311.

At 1310, a clock operation is performed to move data across time frames. The clocking operation transfers the D values on flip-flops of the original circuit and the retimed circuit to the Q values which results in entering a new time frame. To enable uniform treatment of initial states, the clocking operation transfers the D value to an initial state, I value. The constraints themselves ensure that the initial state I values are transferred to the Q variables. The clock operation may be implemented with the following.

```
task clock it( );
    //Original circuit
    foreach(o_in1_ff_i[i]) begin
        o_in1_ff_i[i]=o_in1_ff_d[i];
    end
    foreach(o_in2_ff_i[i]) begin
        o_in2_ff_i[i]=o_in2_ff_d[i];
    end
    foreach(o_z6_ff_i[i]) begin
        o_z6_ff_i[i]=o_z6_ff d[i];
    end
    o_i3=o_d3;
    //Retimed circuit
    foreach(r_z3_ff_i[i]) begin
        r_z3_ff_i[i]=r_z3_ff_d[i];
    end
    foreach(r_z4_ff_i[i]) begin
        r_z4_ff_i[i]=r_z4_ff_d[i];
    end
    foreach(r_z5_ff_i[i]) begin
        r_z5_ff_i[i]=r_z5_ff_d[i];
    end
    r_i3=r_d3;
endtask
```

At 1311, an indication is generated that verification of initial states of changed flip-flops was successful.

At 1312, an indication is generated that verification of initial states of changed flip-flops was unsuccessful.

It should be appreciated that the compare points described with reference to the present disclosure may also be used to perform bounded sequential logic simulation in a different manner. For example, the compare points may be used in a simulator such as VCS, ModelSim, or other simulator without using constraint language. The compare points may then be modeled as assertions during the simulation.

FIGS. 1, 4-5, 8-10, and 12-13 are flow charts that illustrate embodiments of the present invention. The procedures described in these figures may be performed by an EDA tool implemented by a computer system. Some of the techniques illustrated may be performed sequentially, in parallel or in an order other than that which is described and that the procedures described may be repeated. It is appreciated that not all of the techniques described are required to be performed, that additional techniques may be added, and that some of the illustrated techniques may be substituted with other techniques.

Figure 14:
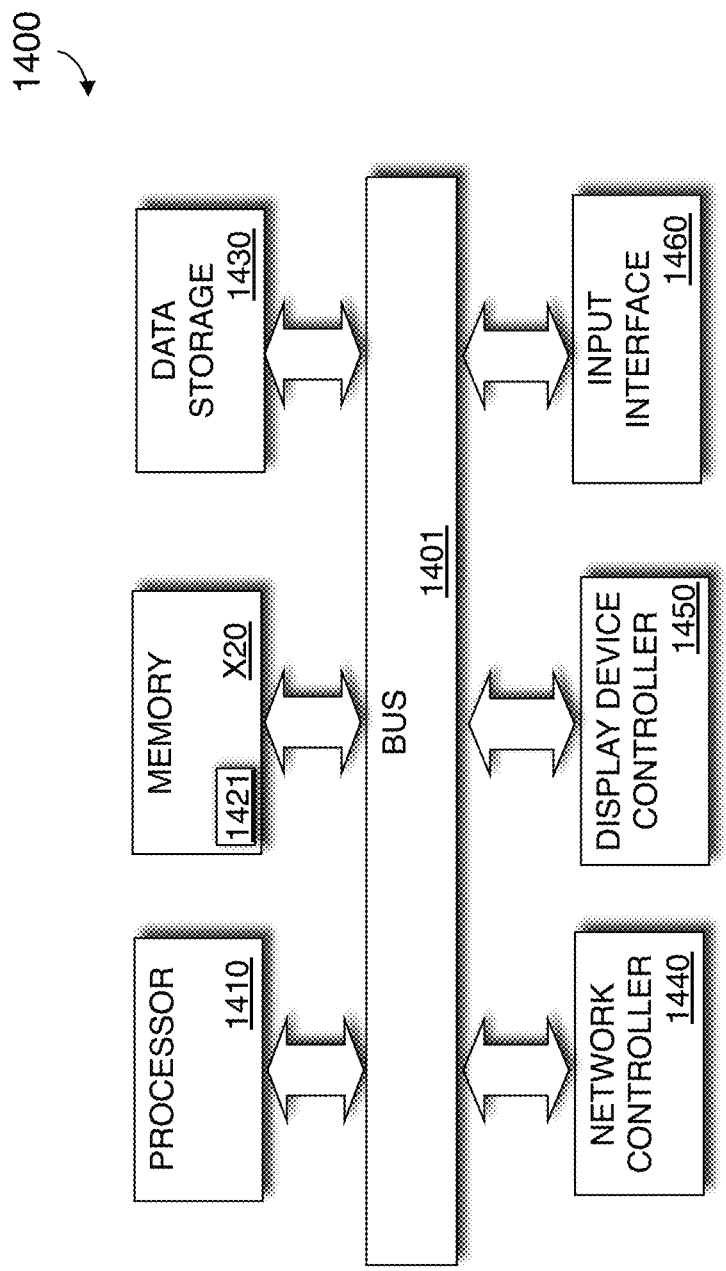
FIG. 14 illustrates a block diagram of a computer system implementing a system designer according to an exemplary embodiment of the present disclosure.

FIG. 14 is a block diagram of an exemplary computer system 1400 in which an example embodiment of the present invention resides. The computer system 1400 includes a processor 1410 that process data signals. The processor 1410 is coupled to a bus 1401 or other switch fabric that transmits data signals between processor 1410 and other components in the computer system 1400. The computer system 1400 includes a memory 1420. The memory 1420 may store instructions and code represented by data signals that may be executed by the processor 1410. A data storage device 1430 is also coupled to the bus 1401.

A network controller 1440 is coupled to the bus 1401. The network controller 1440 may link the computer system 1400 to a network of computers (not shown) and supports communication among the machines. A display device controller 1450 is coupled to the bus 1401. The display device controller 1450 allows coupling of a display device (not shown) to the computer system 1400 and acts as an interface between the display device and the computer system 1400. An input interface 1460 is coupled to the bus 1401. The input interface 1460 allows coupling of an input device (not shown) to the computer system 1400 and transmits data signals from the input device to the computer system 1400.

A system designer 1421 may reside in the memory 1420 and be executed by the processor 1410. The system designer 1421 may operate to design a system by performing synthesis, placement, and routing on the system. The system designer 1421 may also perform register retiming and verification of the retimed system. According to an embodiment of the present disclosure, verification may include verifying structural correctness of the retimed circuit, verifying initial states equivalence of unchanged flip-flops in the retimed circuit, and verifying initial states equivalence of changed flip-flops in the retimed circuit.

Figure 15:
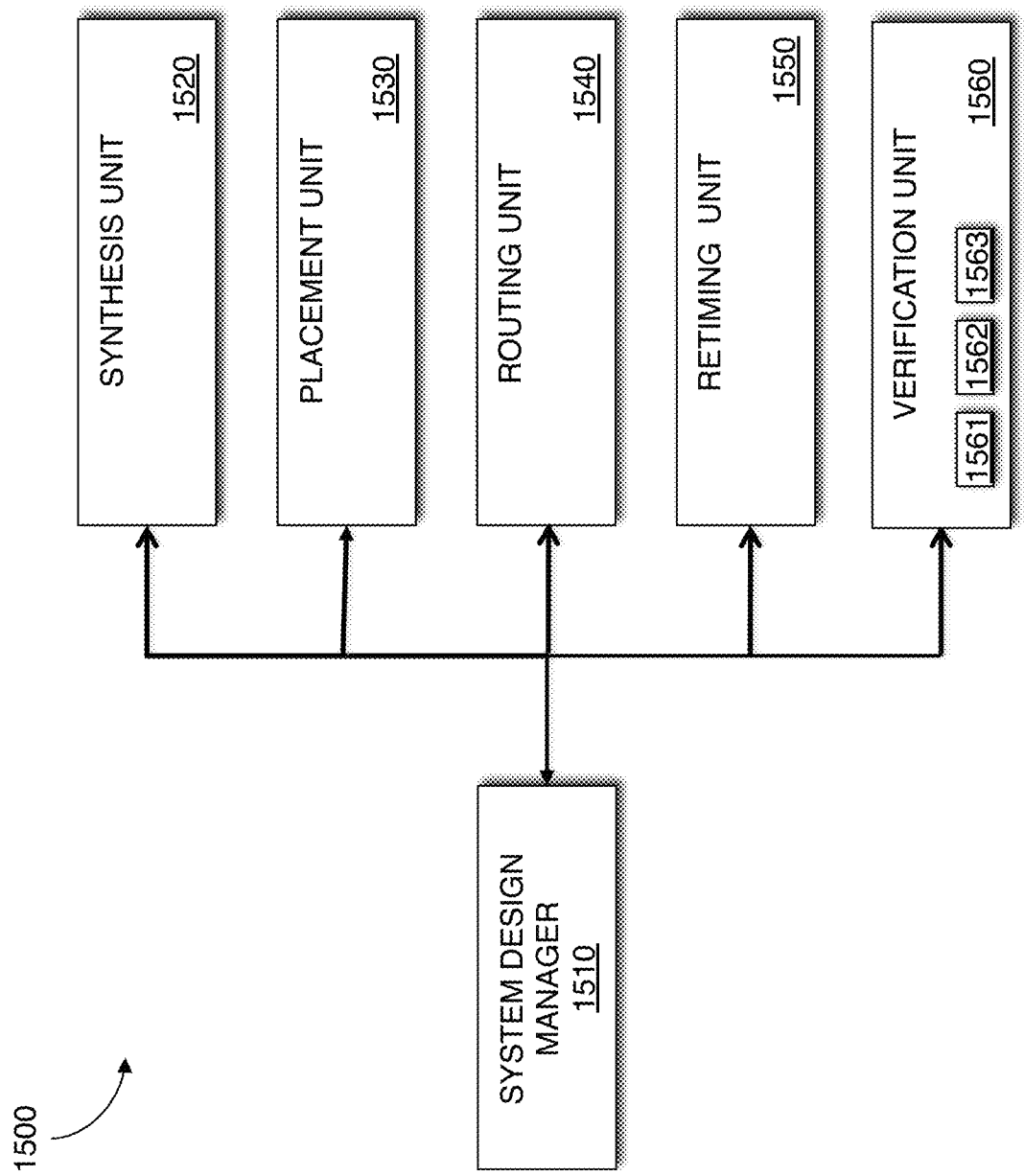
FIG. 15 is a block diagram of a system designer according to an exemplary embodiment of the present disclosure.

FIG. 15 illustrates a system designer 1500 according to an embodiment of the present invention. The system designer 1500 may be an EDA tool for designing a system on a target device such as an FPGA, structured application-specific integrated circuit (ASIC), or other circuitry. FIG. 15 illustrates modules implementing an embodiment of the system designer 1500. According to one embodiment, the modules represent software modules and system design may be performed by a computer system such as the one illustrated in FIG. 14 executing sequences of instructions represented by the modules shown in FIG. 15. Execution of the sequences of instructions causes the computer system to support system design as will be described hereafter. In alternate embodiments, hard-wire circuitry may be used in place of or in combination with software instructions to implement embodiments of present invention. Thus, embodiments of present invention are not limited to any specific combination of hardware circuitry and software.

The system designer 1500 includes a designer manager 1510. The designer manager 1510 is connected to and transmits data between the components of the system designer 1500.

The system designer 1500 includes a synthesis unit 1520 that generates a logic design of a system to be implemented on the target device. According to an embodiment of the system designer 1500, the synthesis unit 1520 takes a conceptual HDL design definition and generates an optimized logical representation of the system. The optimized logical representation of the system generated by the synthesis unit 1520 may include a representation that has a reduced number of functional blocks and registers, such as logic gates and logic elements, required for the system. Alternatively, the optimized logical representation of the system generated by the synthesis unit 1520 may include a representation that has a reduced depth of logic and that generates a lower signal propagation delay.

The synthesis unit 1520 also performs technology mapping. Technology mapping involves determining how to implement the functional blocks and registers in the optimized logic representation utilizing specific resources such as cells on a target device thus creating an optimized "technology-mapped" netlist. The technology-mapped netlist illustrates how the resources (cells) on the target device are utilized to implement the system. In an embodiment where the target device is an FPGA, the technology-mapped netlist may include cells such as logic array blocks (LABs), registers, memory blocks, digital signal processing (DSP) blocks, input output (IO) elements or other components.

The system designer 1500 includes a placement unit 1530 that processes the optimized technology-mapped netlist to produce a placement for each of the functional blocks. The placement identifies which components or areas on the target device are to be used for specific functional blocks and registers.

The system designer 1500 includes a routing unit 1540 that determines the routing resources on the target device to use to provide interconnection between the components implementing functional blocks and registers of the logic design.

The system designer 1500 includes a retiming unit 1550 that improves the performance of sequential circuits in the system by repositioning flip-flops (registers) without changing the combinational path(s) between flip-flops and/or input outputs (IOs) that have the worst delay. The retiming unit 1550 may perform the optimizations described with reference to FIGS. 2A-2C.

The system designer 1500 includes a verification unit 1560 that confirms whether a retimed design for the system is equivalent to the original design. According to an embodiment of the present disclosure, the verification unit 1560 verifies that a circuit before retiming is functionally equivalent to the circuit after retiming. As such, the verification unit 1560 uses the netlist before and after retiming and the initial states of all flip-flops in the original and retimed circuits. The verification unit 1560 includes a structural correctness verifier unit 1561 that determines whether a retimed circuit is structurally correct. The verification unit 1560 includes an unchanged flip-flop initial state equivalence unit 1562 that determines whether initial states of unchanged flip-flops in retimed circuits are equivalent. The verification unit 1560 includes a changed flip-flop initial state equivalence unit 1563 that determines whether initial states of changed flip-flops in retimed circuits are equivalent.

It should be appreciated that the register retiming unit 1550 may perform register retiming and the verification unit 1560 may perform verification during and/or after synthesis, placement, and/or routing.

It should be appreciated that embodiments of the present invention may be provided as a computer program product, or software, that may include a computer-readable or machine-readable medium having instructions. The instructions on the computer-readable or machine-readable medium may be used to program a computer system or other electronic device. The machine-readable medium may include, but is not limited to, floppy diskettes, optical disks, CD-ROMs, and magneto-optical disks or other type of media/machine-readable medium suitable for storing electronic instructions. The techniques described herein are not limited to any particular software configuration. They may find applicability in any computing or processing environment. The terms "computer-readable medium" or "machine-readable medium" used herein shall include any medium that is capable of storing or encoding a sequence of instructions for execution by the computer and that cause the computer to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

Figure 16:
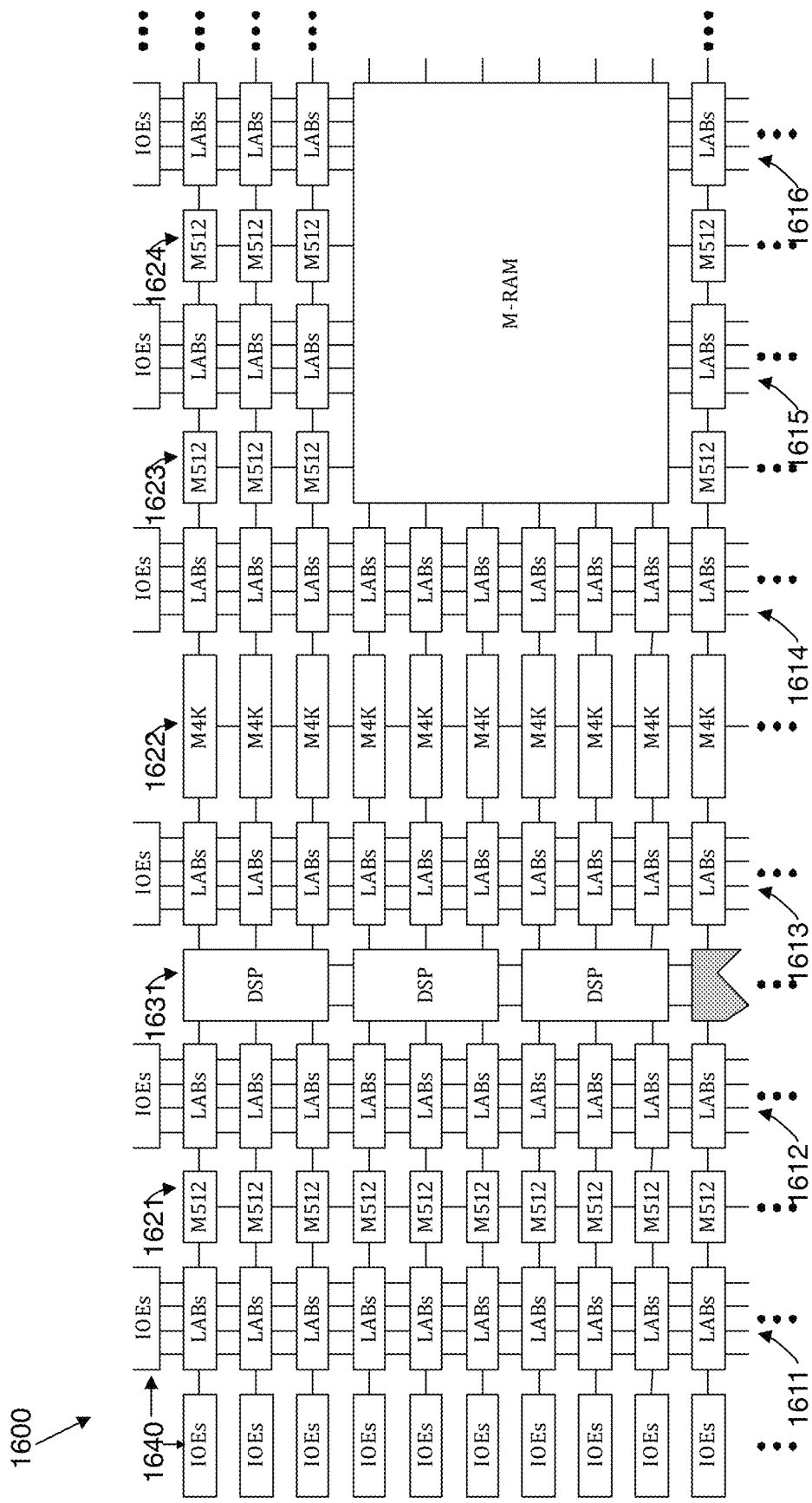
FIG. 16 illustrates an exemplary target device according to an exemplary embodiment of the present disclosure.

FIG. 16 illustrates a device 1600 that may be used to implement a target device according to an embodiment of the present invention. The device 1600 is a field programmable gate array (FPGA) that includes a plurality of logic-array blocks (LABs). According to an embodiment of the present invention, the device 1600 may be implemented on a single integrated circuit. Each LAB may be formed from a plurality of logic blocks, carry chains, LAB control signals, look up table (LUT) chain, and register chain connection lines. A logic block is a small unit of logic providing efficient implementation of user logic functions. A logic block includes one or more combinational cells, where each combinational cell has a single output, and registers. According to one embodiment of the present invention, the logic block may operate similarly to a logic element (LE), such as those found in the Stratix or Cyclone devices manufactured by Altera Corporation, or a combinational logic block (CLB) such as those found in Virtex devices manufactured by Xilinx Inc. In this embodiment, the logic block may include a four input LUT with a configurable register. According to an alternate embodiment of the present invention, the logic block may operate similarly to an adaptive logic module (ALM), such as those found in Stratix devices manufactured by Altera Corporation. LABs are grouped into rows and columns across the device 1600. Columns of LABs are shown as 1611-1616. It should be appreciated that the logic block may include additional or alternate components.

The device 1600 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the device in between selected LABs or located individually or in pairs within the device 1600. Columns of memory blocks are shown as 1621-1624.

The device 1600 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the device 1600 and are shown as 1631.

The device 1600 includes a plurality of input/output elements (IOEs) 1640. Each IOE feeds an IO pin (not shown) on the device 1600. The IOEs 1640 are located at the end of LAB rows and columns around the periphery of the device 1600. Each IOE may include a bidirectional IO buffer and a plurality of registers for registering input, output, and output-enable signals.

The device 1600 may include routing resources such as LAB local interconnect lines, row interconnect lines ("H-type wires"), and column interconnect lines ("V-type wires") (not shown) to route signals between components on the target device. Although the exemplary device 1600 illustrated in FIG. 16 is a FPGA, the present disclosure may be applied to ASICs and to any general digital circuit implementation.

In the foregoing specification, embodiments of the invention have been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

The invention claimed is:

1. A method for designing a system on a target device, comprising:
performing register retiming on an original design to generate a retimed design of the system;
generating a first retiming graph of the original design;
generating a second retiming graph of the retimed design, wherein the first and second retiming graphs comprise vertices representing combinatorial gates and edges representing connections between the combinatorial gates, and wherein each of the edges comprises an edge weight that represents a number of flip-flops on that edge;
computing retiming labels of each of the vertices from the edge weights of the first and second retiming graphs during verification of structural correctness of the retimed design;
identifying compare points in the original design and the retimed design where signal values reflect initial states of one or more flip-flops by using the retiming labels that reflect a number and direction of register movement relative to a node in the retimed design;
performing bounded sequential logic simulation within a time frame, wherein the time frame is determined from a maximum absolute value of the retiming labels;
determining whether changed flip-flops in the retimed design have initial states that are correct by comparing signal values at the compare points from the bounded sequential logic simulation;
generating a data file that describes the retimed design for the system in response to determining that the changed flip-flops in the retimed design have correct initial states; and
programming the target device with the data file to physically transform components on the target device to implement the system.

2. The method of claim 1, wherein a changed flip-flop is a flip-flop that has been re-positioned from the original design.

3. The method of claim 1, wherein an initial state is a state of a register at power-up.

4. The method of claim 1, wherein determining whether changed flip-flops in the retimed design have initial states that are correct is performed in response to determining that unchanged flip-flops in the retimed design have initial states that are correct by representing initial states for the unchanged flip-flops in the original design and the retimed design as arrays of values, by computing indices for each of the arrays using the retiming labels, and by comparing values of the unchanged flip-flops in one of the arrays representing the retimed design and in one of the arrays representing the original design to determine equivalence of the initial states of the unchanged flip-flops.

5. The method of claim 1 further comprising generating an indication of the correctness of the initial states of the changed flip-flops.

6. A method for designing a system on a target device, comprising:
performing register retiming on an initial design to generate a retimed design;
determining whether the retimed design is structurally correct by performing retiming on the retimed design, and determining whether performing register retiming on the retimed design results in the initial design by generating a first retiming graph of the initial design, by generating a second retiming graph of the retimed design, wherein the first and second retiming graphs comprise vertices representing combinatorial gates and edges representing connections between the combinatorial gates, each of the edges comprising an edge weight that represents a number of flip-floDs on that edge, and by computing retiming labels of each of the vertices based on the edge weights of the first and second retiming graphs;
determining whether unchanged registers in the retimed design have initial states that are correct in response to determining whether the retimed design is structurally correct by representing the initial states for the unchanged registers in the initial design and the retimed design as arrays of values, by computing indices for each of the arrays using the retiming labels, and by comparing values of the unchanged registers in one of the arrays representing the retimed design and in one of the arrays representing the initial design to determine equivalence of the initial states of the unchanged registers;
identifying compare points in the initial design and the retimed design that reflect behavior of changed registers by using the retiming labels that reflect a number and direction of register movement relative to a node in the retimed design;
performing bounded seauential logic simulation within a time frame, wherein the time frame is determined from a maximum absolute value of the retiming labels;
determining whether the changed registers in the retimed design have initial states that are correct by comparing signal values at the compare points from the bounded seauential logic simulation in response to determining that the unchanged registers in the retimed design have initial states that are correct;
generating a data file that describes the retimed design for the system in response to determining that the changed and unchanged registers in the retimed design have correct initial states; and
programming the target device with the data file to physically transform components on the target device to implement the system.

7. The method of claim 6, wherein an initial state is a state of a register at power-up.

8. The method of claim 6, wherein determining whether unchanged registers in the retimed design have initial states that are correct further comprises identifying the one or more unchanged registers on the retimed design by:
utilizing the indices to determine whether an unchanged register resides on one of the edges.

9. The method of claim 8, wherein computing indices for each of the arrays using the retiming labels comprises:
identifying a left index for each edge on the initial design and the retimed design; and
identifying a right index for each edge on the initial design and the retimed design, wherein the values for the left index and the right index for each edge reflect whether one or more unchanged registers resides on each edge.

10. The method of claim 6, wherein
the changed registers are registers that have been repositioned from the initial design.

11. The method of claim 6, further comprising:
generating an indication of correctness of the initial states of the changed registers.

12. The method of claim 6, wherein comparing signal values at the compare points comprises:
modeling the compare points as constraints;
solving for the constraints at the time frame determined; and
determining that the changed registers in the retimed design have initial states that are correct if the constraints are solvable at the time frame determined.

13. The method of claim 6, wherein the bounded sequential logic simulation is performed using a constraint solver.

14. A non-transitory computer readable medium including a sequence of instructions stored thereon for causing a computer to execute a method for designing a system on a target device, comprising:
performing register retiming on an original design to generate a retimed design of the system;
generating a first retiming graph of the original design;
generating a second retiming graph of the retimed design, wherein the first and second retiming graphs comprise vertices representing combinatorial gates and edges representing connections between the combinatorial gates, and wherein each of the edges comprises an edge weight that represents a number of flip-flops on that edge;
computing retiming labels of each of the edges from the edge weights of the first and second retiming graphs during verification of structural correctness of the retimed design;
identifying compare points from the original design and the retimed design where signal values reflect initial states of one or more flip-flops, wherein the compare points are identified from the retiming labels that reflect a number and direction of register movement relative to a node on the system after register retiming;
performing bounded sequential logic simulation within a time frame, wherein the time frame is determined by a maximum absolute value of the retiming labels;
determining whether changed flip-flops in the retimed design have initial states that are correct by comparing signal values at the compare points from the bounded sequential logic simulation;
generating a data file that describes the retimed design for the system in response to determining that the changed flip-flops in the retimed design have correct initial states; and
programming the target device with the data file to physically transform components on the target device to implement the system.

15. The non-transitory computer readable medium of claim 14 further comprising generating an indication of the correctness of the initial states of the changed flip-flops.

16. The non-transitory computer readable medium of claim 14 further comprising:
determining whether unchanged registers in the retimed design have initial states that are correct in response to determining whether the retimed design is structurally correct by representing the initial states for the unchanged registers in the original design and the retimed design as arrays of values, by computing indices for each of the arrays using the retiming labels, and by comparing values of the unchanged registers in one of the arrays representing the retimed design and in one of the arrays representing the original design to determine equivalence of the initial states of the unchanged registers.

17. The non-transitory computer readable medium of claim 14, wherein the changed flip-flops are flip-flops that have been re-positioned from the original design.

18. The non-transitory computer readable medium of claim 14, wherein an initial state is a state of a flip-flop at power-up.

* * * * *